United States Patent
Ueda et al.

(10) Patent No.: US 8,331,520 B2
(45) Date of Patent: Dec. 11, 2012

(54) PHASE-LOCKED LOOP CIRCUIT AND COMMUNICATION APPARATUS

(75) Inventors: Keisuke Ueda, Kanagawa (JP); Toshiya Uozumi, Kanagawa (JP); Ryo Endo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 390 days.

(21) Appl. No.: 12/790,319

(22) Filed: May 28, 2010

(65) Prior Publication Data

US 2011/0007859 A1  Jan. 13, 2011

(30) Foreign Application Priority Data

Jul. 13, 2009  (JP) .................................. 2009-164725

(51) Int. Cl.
  *H03D 3/24* (2006.01)
(52) U.S. Cl. ...................................................... 375/376
(58) Field of Classification Search .................. 375/373, 375/374, 375, 376
  See application file for complete search history.

(56) References Cited

U.S. PATENT DOCUMENTS 5,973,525 A  10/1999  Fujii
7,728,657 B2 *  6/2010  Kita ............................... 329/307
2009/0153194 A1 *  6/2009  Cumming et al. .............. 326/93

FOREIGN PATENT DOCUMENTS

| JP | 10-070456 | 3/1998 |
| JP | 11-127062 | 5/1999 |
| JP | 2008-160594 | 7/2008 |

* cited by examiner

*Primary Examiner* — Jaison Joseph
(74) *Attorney, Agent, or Firm* — McDermott Will & Emery LLP

(57) ABSTRACT

A PLL circuit of which low power consumption and miniaturization are satisfied at the same time is provided. A phase comparator of the PLL circuit includes a counter and a time-to-digital converter. The counter receives a reference clock signal and a low frequency clock signal obtained by dividing an output of a digital controlled oscillator, and a high frequency clock signal. The counter detects a phase difference between the reference clock signal and the low frequency clock signal by counting the clock number of the high frequency clock signal. The time-to-digital converter receives the reference clock signal and the low frequency clock signal. The time-to-digital converter detects the phase difference between the reference clock signal and the low frequency clock signal to the accuracy of a time period shorter than a cycle of the high frequency clock signal, after the output of counter reaches a predetermined range.

9 Claims, 19 Drawing Sheets

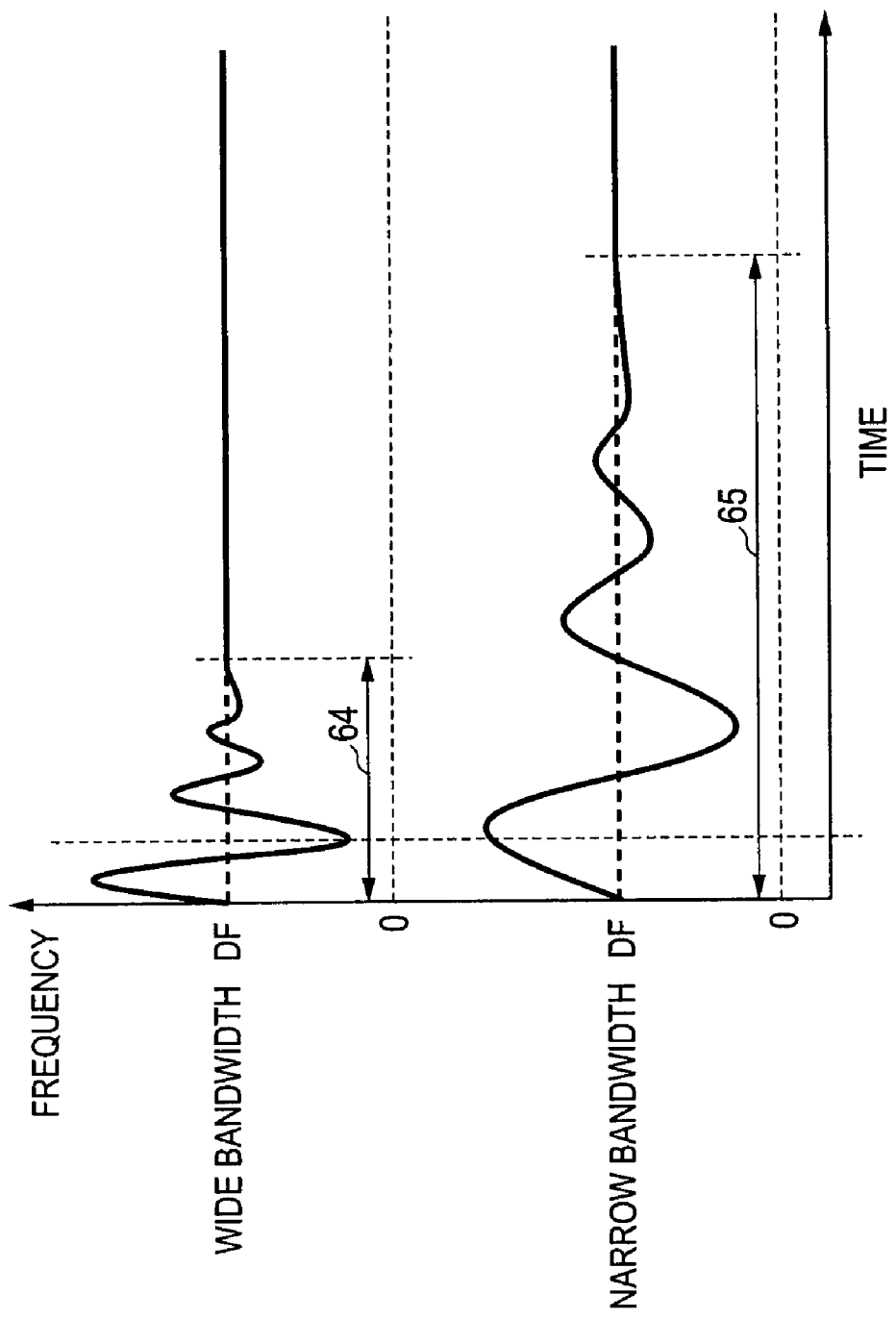

PHASE-LOCKED LOOP CIRCUIT AND COMMUNICATION APPARATUS

CROSS REFERENCE TO RELATED APPLICATIONS

The disclosure of Japanese Patent Application No. 2009-164725 filed on Jul. 13, 2009 including the specification, drawings, and abstract is incorporated herein by reference in its entirety.

BACKGROUND OF THE INVENTION

The present invention relates to a phase-locked loop circuit, specifically relates to a digital phase-locked loop circuit of which the main components are composed of a digital circuit. The present invention further relates to a communication apparatus which employs the phase-locked loop circuit.

A phase-locked loop circuit (PLL circuit) is employed as a reference signal source of a radio frequency integrated circuit (RF-IC). In recent years, development of an all digital PLL circuit (ADPLL circuit) in which all the passive elements of a PLL circuit are replaced with a digital circuit is advancing. In employing a PLL circuit for wireless terminals, such as a mobile-phone and a wireless local area network (WLAN), low power consumption becomes an important factor which determines worth of the product. As a PLL circuit which is able to operate with low power consumption, technology described in the following patent documents is known, for example.

Japanese Unexamined Patent Publication No. 2008-160594 (hereinafter referred to as Patent Document 1) discloses an ADPLL circuit which employs a time-to-digital converter (TDC). The time-to-digital converter disclosed by Patent Document 1 is provided with a switching element for changing the number of stages of delay circuits in operation corresponding to an input frequency, with the use of a frequency control signal which controls an oscillating frequency. Since only the delay circuits of a required number of stages operate corresponding to a cycle of the input frequency, the present time-to-digital converter can support an operation in a wide-band frequency range, in addition, it can attain low power consumption of the entire system, especially at a high input frequency.

A PLL circuit disclosed by Japanese Unexamined Patent Publication No. Hei 11(1999)-127062 (hereinafter referred to as Patent Document 2) has a phase comparator circuit which compares a phase of a reference clock obtained by dividing a supplied clock with a divider and a phase of a variable clock. The phase comparator circuit lowers the frequency of operation of own circuit by increasing a dividing ratio of the divider, when it is detected that the phases of both clocks are in agreement. Accordingly, the power consumption of the PLL circuit can be reduced. At the time of reset which returns the state from the non-active state to the active state, the frequency of operation of the phase comparator circuit returns to the original high state by setting the dividing ratio of the divider to the original low value. Therefore, time required for phase synchronization of both clocks can be shortened.

A digital PLL circuit disclosed by Japanese Unexamined Patent Publication No. Hei 10(1998)-070456 (hereinafter referred to as Patent Document 3) is provided with a circuit which detects that the phases of two signals are in agreement. The digital PLL circuit stops a phase adjustment operation, while the phases of two signals are in agreement. As a result, deterioration of the phase adjustment capability due to the low power consumption does not arise.

(Patent Document 1) Japanese Unexamined Patent Publication No. 2008-160594

(Patent Document 2) Japanese Unexamined Patent Publication No. Hei 11(1999)-127062

(Patent Document 3) Japanese Unexamined Patent Publication No. Hei 10(1998)-070456

SUMMARY OF THE INVENTION

By the way, as for a PLL circuit employed in a portable wireless terminal, low power consumption is desirable for extending a standby time, and miniaturization is desirable for reducing packaging areas. In the case of above-described Patent Document 1, in order to support an operation in a wide-band frequency range, it is necessary to increase the number of stages of delay cells employed for the time-to-digital converter. Therefore, the circuit area becomes large. Technologies disclosed by Patent Document 2 and Patent Document 3 do not have an effect of reduction of circuit areas.

The present invention has been made in view of the above circumstances and provides a PLL circuit in which low power consumption and miniaturization are equally attainable. The present invention also intends to provide a communication apparatus which employs the PLL circuit and realizes more reduced power consumption and smaller circuit area than before.

A phase-locked loop circuit according to one embodiment of the present invention comprises an oscillator, a divider, and a phase comparator. The oscillator oscillates at a frequency corresponding to a phase difference signal. The divider generates a first clock obtained by dividing an output of the oscillator and a second clock higher than the first clock in frequency. The phase comparator includes a first detector and a second detector. The first detector receives the first clock, the second clock, and a reference clock. The first detector detects a phase difference between the first clock and the reference clock to an accuracy of a first time period given by a cycle of the second clock, and outputs the phase difference signal corresponding to the detected phase difference until the detected phase difference reaches a predetermined range. The second detector receives the first clock and the reference clock. The second detector detects the phase difference between the first clock and the reference clock to an accuracy of a second time period shorter than the first time period after the phase difference detected by the first detector reaches the predetermined range, and outputs the phase difference signal corresponding to the detected phase difference.

According to the above-described embodiment, the phase difference is detected by the second detector having higher phase detection accuracy than the first detector, after the phase difference detected by the first detector reaches the predetermined range. Accordingly, it is possible to provide a PLL circuit of which the low power consumption and the miniaturization are equally attained.

BRIEF DESCRIPTION OF THE DRAWINGS

FIG. 12 (B) is another waveform chart for explaining operation of the digital phase-frequency detector 2 in Mode 2;

FIG. 12 (C) is a further another waveform chart for explaining operation of the digital phase-frequency detector 2 in Mode 2;

FIG. 24 (B) is a drawing illustrating another relation between the phase difference of an input signal and the output of the digital phase-frequency detector 2A illustrated in FIG. 22;

FIG. 29 is an explanatory drawing of lock-up time of the ADPLL circuit 1C illustrated in FIG. 27.

DETAILED DESCRIPTION OF THE INVENTION

Hereinafter, with reference to the accompanying drawings, the embodiments of the present invention are explained in detail. The same reference symbol will be given to the same portion or the corresponding portion, and the explanation thereof is not repeated.

(Embodiment 1)

(Configuration of ADPLL Circuit 1)

Figure 1:
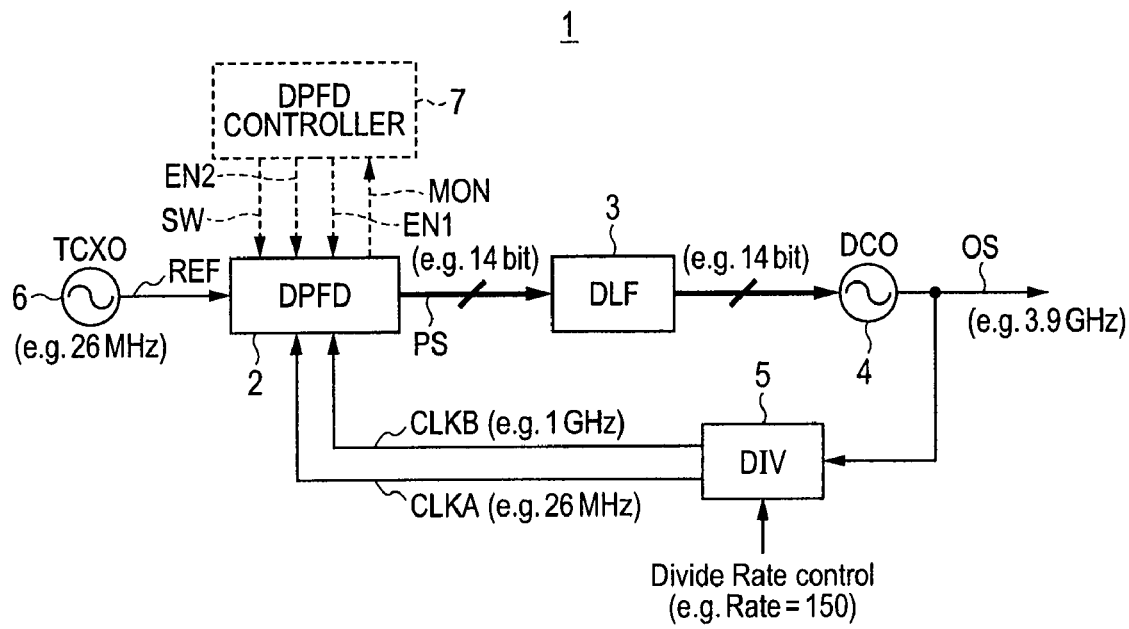
FIG. 1 is a block diagram illustrating configuration of an ADPLL circuit 1 according to Embodiment 1 of the present invention.

FIG. 1 is a block diagram illustrating configuration of an ADPLL circuit 1 according to Embodiment 1 of the present invention. In FIG. 1, an ADPLL circuit 1 corresponds to a circuit which generates a highly-accurate high frequency clock in an RF-IC chip, for example. The ADPLL circuit 1 includes a digital controlled oscillator (DC0) 4, a divider (DIV) 5, a digital phase-frequency detector (DPFD) 2, and a digital loop filter (DLF) 3.

The digital controlled oscillator 4 oscillates at a frequency corresponding to a digital output of the digital loop filter 3. Publicly known configuration can be employed for the digital controlled oscillator 4. For example, a ring oscillator composed of plural inverters is known as a digital controlled oscillator. In this case, corresponding to the multi-bit digital output of the digital loop filter 3, the inverters are individually controlled to turn into an active state or a non-active state. Another known example of the digital controlled oscillators includes configuration in which an LC resonance circuit is coupled as a load to a pair of amplification elements which are cross-coupled each other. In the configuration, coupling of plural capacitors employed for the LC resonance circuit is changed corresponding to the multi-bit digital output of the digital loop filter 3.

The divider 5 receives an output signal of the digital controlled oscillator 4, and outputs a low frequency clock signal CLKA which is obtained by dividing the frequency of the output signal. The divider 5 also outputs a high frequency clock signal CLKB which is higher than the low frequency clock signal CLKA in frequency. In the case of the example illustrated in FIG. 1, the oscillating frequency of the digital controlled oscillator 4 is 3.9 GHz, and the frequency of the low frequency clock signal CLKA is 26 MHz which is obtained by dividing the oscillating frequency of the digital controlled oscillator 4 to $1/150$. The frequency of the high frequency clock signal CLKB is about 1 GHz which is higher than the frequency of the low frequency clock signal CLKA.

The digital phase-frequency detector 2 (phase comparator) receives a reference clock signal REF outputted from a temperature compensated crystal oscillator (TCXO) 6 and the low frequency clock signal CLKA and the high frequency clock signal CLKB. The digital phase-frequency detector 2 detects the phase difference between the reference clock signal REF and the low frequency clock signal CLKA, and outputs a phase difference signal PS corresponding to the detected phase difference. Practically, instead of detecting the phase difference, the digital phase-frequency detector 2 detects time difference of a rising time (or a falling time) of the reference clock signal REF and the low frequency clock signal CLKA.

The digital loop filter 3 restricts the frequency band of the phase difference signal PS outputted from the digital phase-frequency detector 2. A noise component in a high frequency region of the phase difference signal PS is removed by the digital loop filter 3.

A feedback loop is formed by the digital controlled oscillator 4, the divider 5, the digital phase-frequency detector 2, and the digital loop filter 3, as described above. By the action of the present feedback loop, feedback is performed until the frequency of the low frequency clock signal CLKA outputted from the divider 5 and the frequency of the reference clock signal REF become in agreement. It is referred to as locking that two frequencies are in agreement in this way.

After the frequency has locked, the frequency of an output signal OS of the ADPLL circuit 1 is in agreement with the reference clock signal REF multiplied by the dividing ratio. In a communication apparatus using the ADPLL circuit 1, the output signal OS which is in agreement with the frequency of a carrier can be obtained by setting the dividing ratio of the divider 5 as a predetermined value.

As illustrated in FIG. 1, a DPFD controller 7 is provided in order to control the digital phase-frequency detector 2 of the ADPLL circuit 1. The DPFD controller 7 outputs a control signal SW and enable signals EN1 and EN2, in order to control the digital phase-frequency detector 2 according to the operation mode of the ADPLL circuit 1. The DPFD controller 7 monitors further a phase difference signal PS outputted from the digital phase-frequency detector 2 as a monitor signal MON. The operation mode of the ADPLL circuit 1 will be explained in full detail in FIG. 3.

(Configuration of the Digital Phase-Frequency Detector 2)

Figure 2:
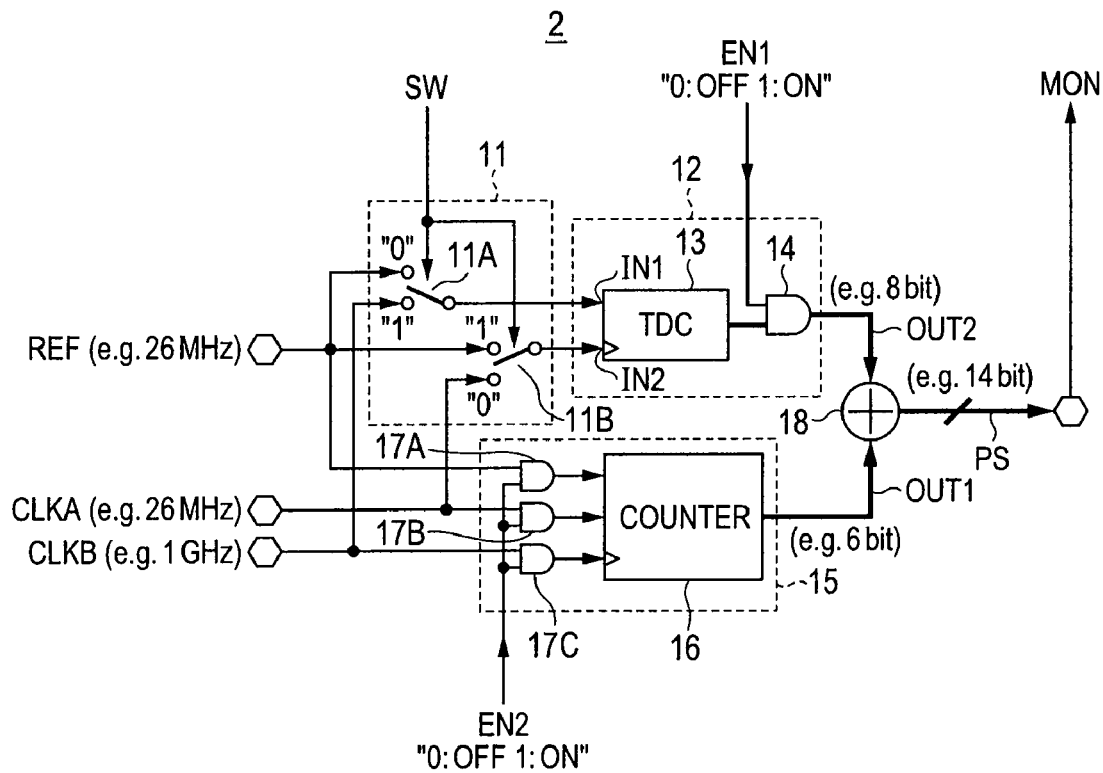
FIG. 2 is a block diagram illustrating configuration of a digital phase-frequency detector 2 of FIG. 1.

FIG. 2 is a block diagram illustrating configuration of a digital phase-frequency detector 2 of FIG. 1. As illustrated in FIG. 2, the digital phase-frequency detector 2 includes a first detector 15, a second detector 12, a switching unit 11, and an adder 18 (phase difference signal generating unit).

The first detector 15 includes a counter 16 and AND circuits 17A, 17B, and 17C for controlling enabling and disenabling of a signal input to the counter 16. (The AND circuits 17A, 17B, and 17C are described as an AND circuit 17 when called collectively, or when indicated as an unspecified element.) The enable signal EN2 is inputted into one of input terminals of each of AND circuits 17A, 17B, and 17C.

When the enable signal EN2 is in an active state (corresponding to "1" or H level), the counter 16 receives the reference clock signal REF, the low frequency clock signal CLKA, and the high frequency clock signal CLKB via the AND circuits 17A, 17B, and 17C, respectively. The counter 16 detects time difference of a rising time between the reference clock signal REF and the low frequency clock signal CLKA by counting a clock number of the high frequency clock signal CLKB. Therefore, detection accuracy of the time difference according to the counter 16 is equal to a cycle of the high frequency clock signal CLKB. The counter 16 outputs to the adder 18 a multi-bit output signal OUT1 corresponding to the detected time difference. Details of the configuration of the counter 16 will be described later with reference to FIG. 6.

The AND circuits 17A, 17B, and 17C provided in the input side of the counter 16 correspond to the reference clock signal REF, the low frequency clock signal CLKA, and the high frequency clock signal CLKB, respectively. Each AND circuit 17 receives the corresponding clock signal and the enable signal EN2, and the input signal to the counter 16 is fixed to "0" (L level) when the enable signal EN2 is in a non-active state (corresponding to "0" or L level). In this case, the output signal OUT1 from the counter 16 becomes a value (0) corresponding to zero phase difference.

The switching unit 11 receives the reference clock signal REF, the low frequency clock signal CLKA, and the high frequency clock signal CLKB, and outputs to the second detector 12 a clock signal selected according to the control signal SW. When the control signal SW is "1" (H level), the switching unit 11 outputs the reference clock signal REF and the high frequency clock signal CLKB to the second detector 12. When the control signal SW is "0" (L level), the switching unit 11 outputs the reference clock signal REF and the low frequency clock signal CLKA to the second detector 12.

More specifically, the switching unit 11 includes a first switch 11A and a second switch 11B which change the connected state, corresponding to the control signal SW. The first switch 11A inputs the high frequency clock signal CLKB to a first input node IN1 of a time-to-digital converter 13 when the control signal SW is "1", and inputs the reference clock signal REF to the first input node IN1 when the control signal SW is "0." The second switch 11B inputs the reference clock signal REF to a second input node IN2 of the time-to-digital converter 13 when the control signal SW is "1", and inputs the low frequency clock signal CLKA to the second input node IN2 when the control signal SW is "0."

The second detector 12 includes the time-to-digital converter (TDC) 13 and plural AND circuits 14 for controlling enabling and disenabling of a signal output from the time-to-digital converter 13. An enable signal EN1 is inputted into one of input terminals of each of the plural AND circuits 14.

The time-to-digital converter 13 receives two clock signals outputted from the switching unit 11 and detects time difference of a rising time of the two clock signals. Specifically, the time-to-digital converter 13 detects the time difference of a rising time by delaying one of the inputted clock signals every predetermined delay time to generate a delayed signal and by comparing the delayed signal with the other one of the inputted clock signals. Since the delay time in the present case is set up shorter than a cycle of the high frequency clock signal CLKB (for example, 20 picoseconds), the time detection accuracy of the time-to-digital converter 13 is better than that of the counter 16. When the enable signal EN1 is in an active state (corresponding to "1" or H level), the time-to-digital converter 13 outputs a multi-bit output signal OUT2 corresponding to the detected time difference to the adder 18 via the plural AND circuits 14. The detailed configuration of the time-to-digital converter 13 will be described later with reference to FIG. 5.

Each AND circuit 14 provided in an output side of the time-to-digital converter 13 corresponds to each bit of the multi-bit output signal OUT2 individually. Each AND circuit 14 receives the output signal OUT2 of the corresponding bit and the enable signal EN1. When the enable signal EN1 is in a non-active state (corresponding to "0" or L level), each AND circuit 14 outputs to the adder 18 a value (0) corresponding to zero phase difference.

The adder 18 combines an output of the first detector 15, and an output of the second detector 12. In the case of FIG. 2, for example, the output signal OUT1 of the first detector 15 of which the resolution is low corresponds to the higher-order bits (9-14 bits), and the output signal OUT2 of the second detector 12 of which the resolution is high corresponds to the lower-order bits (1-8 bits). The adder 18 obtains a phase difference signal PS having a total of 14 bits, by combining the output signal OUT1 corresponding to the higher-order bits and the output signal OUT2 corresponding to the lower-order bits. As an alternative to the case of FIG. 2, the output signal OUT1 of low resolution may correspond to the higher-order bits and the middle bits, and the output signal OUT2 of high resolution may correspond to the middle bits and the lower-order bits. In this case, the adder 18 makes addition for every bit of the common middle bits, to obtain the final phase difference signal PS.

(Operation Mode of the ADPLL Circuit 1)

Next, an operation mode of the ADPLL circuit 1 is explained. The ADPLL circuit 1 illustrated in FIG. 1 has Mode 1 (high tracking range mode) and Mode 2 (power saving mode) as the operation mode.

Figure 3:
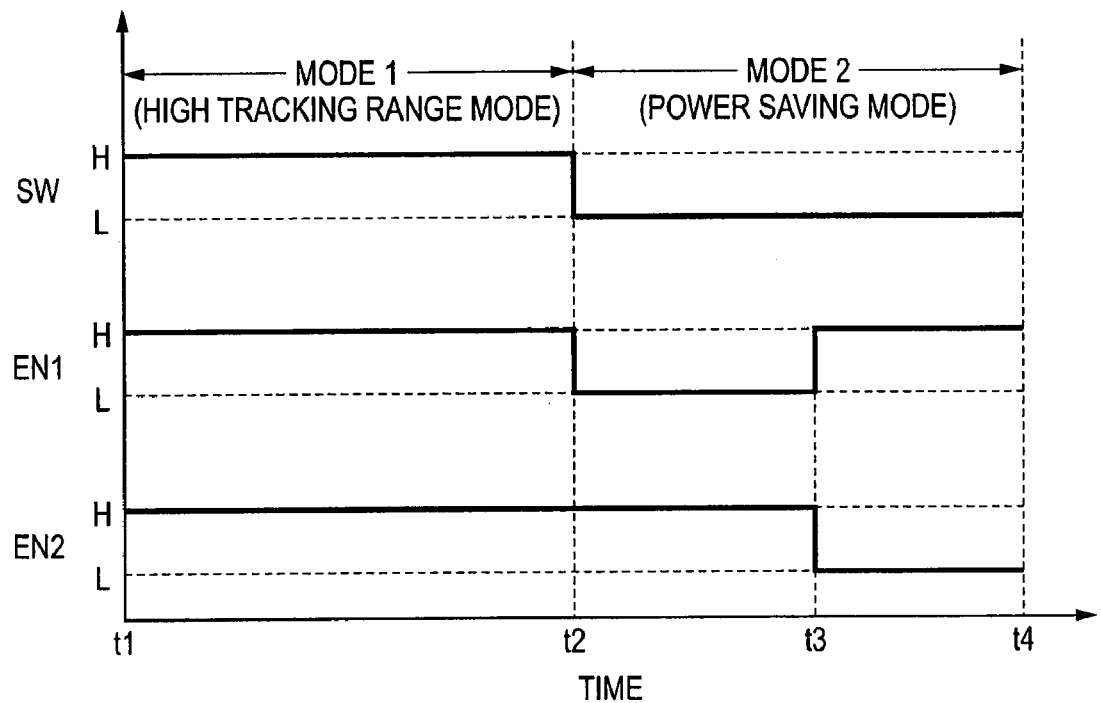
FIG. 3 is a waveform chart for explaining an operation mode of the ADPLL circuit 1.

FIG. 3 is a waveform chart for explaining an operation mode of the ADPLL circuit 1. Beginning at the top, FIG. 3 illustrates the waveforms of the control signal SW and the enable signal EN1, and the enable signal EN2. The waveform in time t1-t2 corresponds to Mode 1, and the waveform in time t2-t4 corresponds to Mode 2. The control signal SW is "1" (H level) In Mode 1, and the control signal SW is "0" (L level) in Mode 2. Therefore, the logical level of the control signal SW corresponds to the operation mode of the ADPLL circuit 1.

In the case of Mode 1 (time t1-t2), all of the control signal SW and the enable signals EN1 and EN2 are set to "1." In this case, the first detector 15 of which the detection accuracy is coarse and the second detector 12 of which the detection accuracy is fine operate in parallel, as will be explained in full detail in FIGS. 4-9.

In the case of Mode 2 (time t2-t4), the operation of the digital phase-frequency detector 2 differs between the coarse adjustment period of time t2-t3 and the fine adjustment period of time t3-t4 which follows the coarse adjustment period. In the coarse adjustment period (time t2-t3), the control signal SW and the enable signal EN1 are set to "0", and the enable signal EN2 is set to "1." By the present setting, detection of the phase difference in the period (time t2-t3) is performed by the first detector 15 of which the detection accuracy is coarse. On the other hand, in the fine adjustment period (time t3-t4), the control signal SW and the enable signal EN2 are set to "0", and the enable signal EN1 is set to "1." By the present setting, detection of the phase difference in the period (time t3-t4) is performed by the second detector 12 of which the detection accuracy is fine.

Shift from the coarse adjustment period to the fine adjustment period is performed based on the monitor signal MON. When the output signal OS of the digital phase-frequency detector 2 of FIG. 1, also serving as the monitor signal MON, reaches a predetermined range, the DPFD controller 7 of FIG. 1 changes the state of the enable signals EN1 and EN2, to perform shifting from the coarse adjustment period to the fine adjustment period. Details of Mode 2 will be explained in FIGS. 10-14.

(Mode 1: High Tracking Range Mode)

Figure 4:
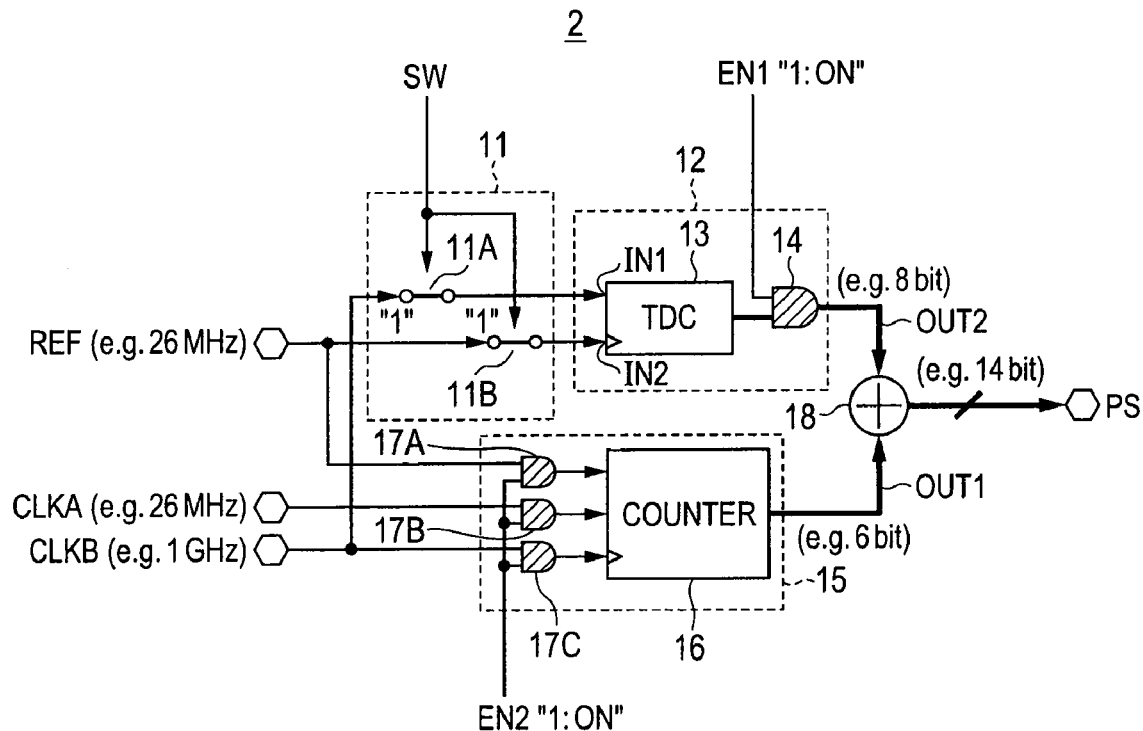
FIG. 4 is a block diagram for explaining operation of the digital phase-frequency detector 2 in Mode 1.

FIG. 4 is a block diagram for explaining operation of the digital phase-frequency detector 2 in Mode 1.

As illustrated in FIG. 4, the control signal SW is "1" in the case of Mode 1, accordingly, the high frequency clock signal CLKB is inputted into the first input node IN1 of the time-to-digital converter 13 via the first switch 11A. In addition, the reference clock signal REF is inputted into the second input node IN2 of the time-to-digital converter 13 via the second switch 11B.

The time-to-digital converter 13 detects the phase difference between the high frequency clock signal CLKB and the reference clock signal REF which are inputted. Since the enable signal EN1 is in an active state ("1"), the signal OUT2 outputted from the time-to-digital converter 13 is inputted into the adder 18.

Furthermore, the enable signal EN2 is in an active state ("1") in Mode 1; accordingly, the reference clock signal REF, the low frequency clock signal CLKA, and the high frequency clock signal CLKB are inputted into the counter 16. The counter 16 detects time difference between the rising time of the reference clock signal REF and the rising time of the low frequency clock signal CLKA, and outputs to the adder 18 the signal OUT1 corresponding to the detected time difference.

Figure 5:
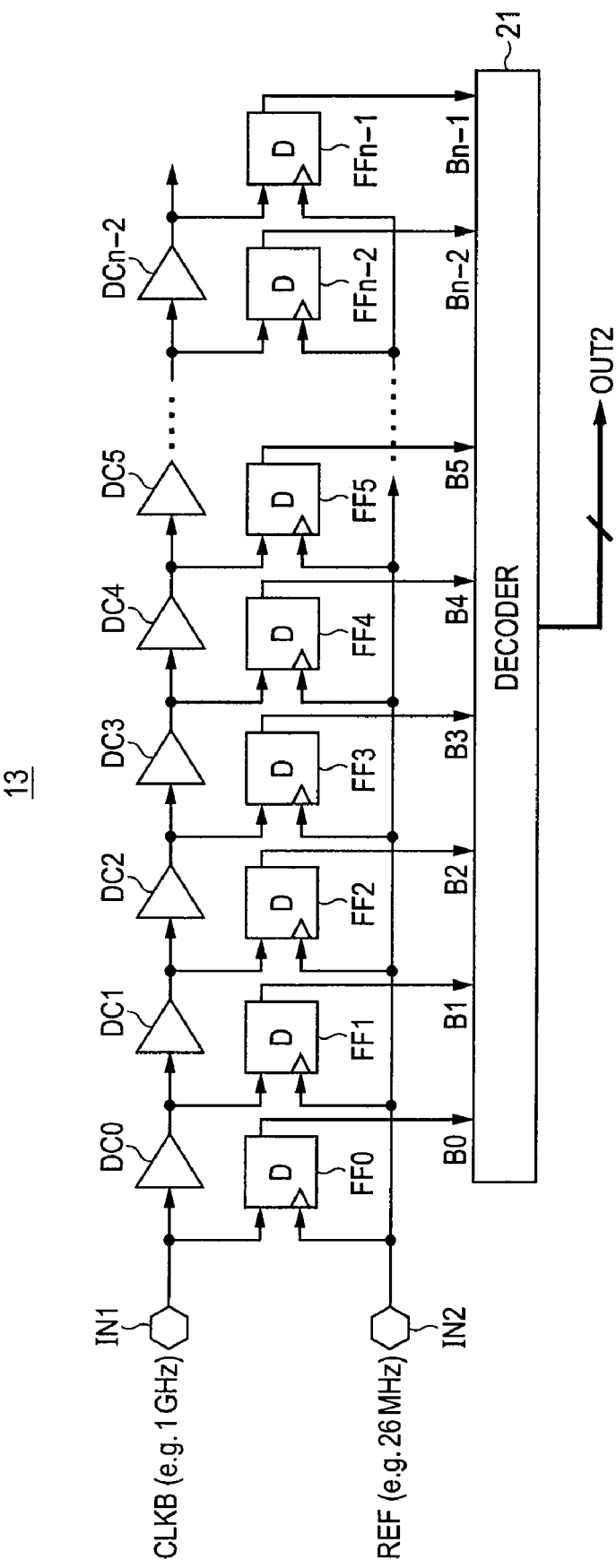
FIG. 5 is a block diagram illustrating configuration of a time-to-digital converter 13 illustrated in FIG. 2.

FIG. 5 is a block diagram illustrating configuration of the time-to-digital converter 13 illustrated in FIG. 2. The time-to-digital converter 13 detects time difference of the rising time of two inputted clock signals. As illustrated in FIG. 5, the time-to-digital converter 13 includes n−1 stages of cascade-coupled delay cells DC0-DCn-2, n-pieces of D flip-flops FF0-FFn-1, and a decoder 21.

The high frequency clock signal CLKB is inputted into the delay cell DC0 in the first stage of the time-to-digital converter 13. The inputted high frequency clock signal CLKB is delayed and transferred one by one by the delay cells DC0-DCn-2. Assuming that the delay time of each of the delay cells DC0-DCn-2 is Td, the delay cell DCx-1 in the x-th stage (x is an integer equal to one or greater and not greater than n−2) outputs a signal which is delayed from the high frequency clock signal CLKB by x·Td (x times Td). The resolution of the time-to-digital converter 13 is decided by the delay time Td, and detectable range by the time-to-digital converter 13 is decided by the number of stages of the delay cells. For example, for detecting a time difference of 5 nanoseconds with a resolution of 20 picoseconds, about 256 stages of delay cells DC0-DCn-2 are required.

The high frequency clock signal CLKB is inputted into an input terminal of the D flip-flop FF0 in the first stage in FIG. 5. An output signal of the x-th delay cell DCx-1 is supplied to an input terminal of the (x+1)-th D flip-flops FFx in the second and latter stage (x is an integer equal to one or greater and not greater than n−2). The common reference clock signal REF is supplied to a clock terminal of each of the flip-flops FF0-FFn-1. Therefore, the D flip-flop FF0 in the first stage holds the high frequency clock signal CLKB at the timing of rising of the reference clock signal REF. The (x+1)-th D flip-flop FFx (x is an integer equal to one or greater and not greater than n−2) holds a signal which is delayed from the high frequency clock signal CLKB by x·Td at the timing of rising of the reference clock signal REF.

The decoder 21 detects the difference of the rising time (phase difference) of two inputted signals, based on the output signals B0-Bn-1 of the D flip-flops FF0-FFn-1. In this case, the value of the output signals B0-Bn-1 changes according to the relation of phase of two inputted signals.

Specifically in FIG. 5, when the high frequency clock signal CLKB rises earlier than the rising time of the reference clock signal REF, the output signals B0-Bn-1 of the D flip-flops FF0-FFn-1 have "1" in succession as much as the difference of the rising time and turn to "0" after that. The point of time when the output signal changes from "1" to "0" corresponds to the rising edge of the high frequency clock signal CLKB. Therefore, the time difference of the rising time can be calculated by multiplying the number of the output signal "1" by the delay time Td of the delay cell.

On the contrary, when the high frequency clock signal CLKB rises after the rising time of the reference clock signal REF, the output signals B0-Bn-1 of the D flip-flops FF0-FFn-1 have "0" in succession and turn to "1" after that. The point of time when the output signal changes from "0" to "1" corresponds to the falling edge of the high frequency clock signal CLKB. Therefore, the time difference of the rising time can be calculated by multiplying the number of the output signal "0" by the delay time of the delay cell and then subtracting the resultant value from a half cycle of the high frequency clock signal CLKB.

Figure 6:
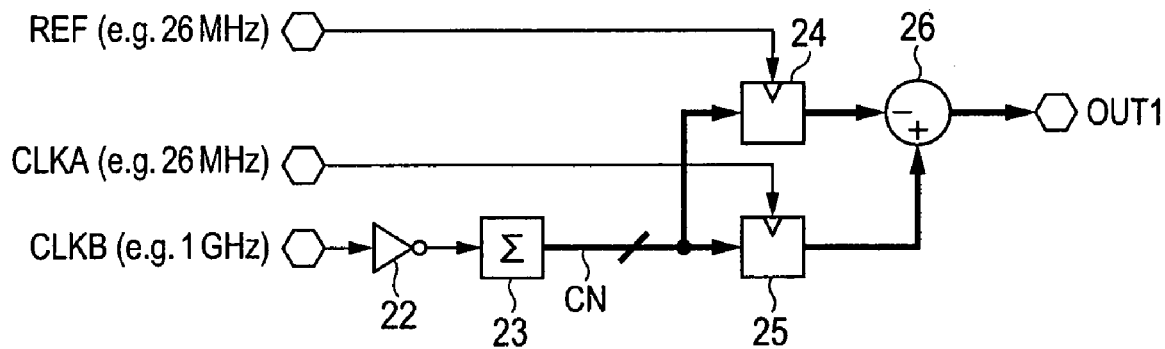
FIG. 6 is a block diagram illustrating configuration of a counter 16 illustrated in FIG. 2.

FIG. 6 is a block diagram illustrating configuration of the counter 16 illustrated in FIG. 2. As illustrated in FIG. 6, the counter 16 includes an inverter 22 which inverts the high frequency clock signal CLKB, an integrator 23 which integrates an output of the inverter 22, a first D flip-flop 24, a second D flip-flop 25, and a subtractor 26. An output signal CN of the integrator 23 corresponds to the number of counts of the high frequency clock signal CLKB. The output signal CN is counted up by one at every timing of falling of the high frequency clock signal CLKB.

The first D flip-flop 24 receives the output signal CN of the integrator 23 at the input terminal thereof, and receives the reference clock signal REF at the clock terminal thereof. The second D flip-flop 25 receives the output signal CN of the integrator 23 at the input terminal thereof, and receives the low frequency clock signal CLKA at the clock terminal thereof. Therefore, the D flip-flops 24 and 25 hold the output signal CN (corresponding to the number of counts) of the integrator at the rising time of the reference clock signal REF and the low frequency clock signal CLKA, respectively.

The subtractor 26 outputs a value of an output of the D flip-flop 25 minus an output of the D flip-flop 24, as an output signal OUT1. Therefore, the output signal OUT1 of the counter 16 corresponds to a value obtained by counting the time difference between the rising time of the low frequency clock signal CLKA and the rising time of the reference clock signal REF, in terms of the clock number of the high frequency clock signal CLKB.

Using an example of a concrete signal waveform, the following explains the operation of the digital phase-frequency detector 2 described above.

Figure 7:
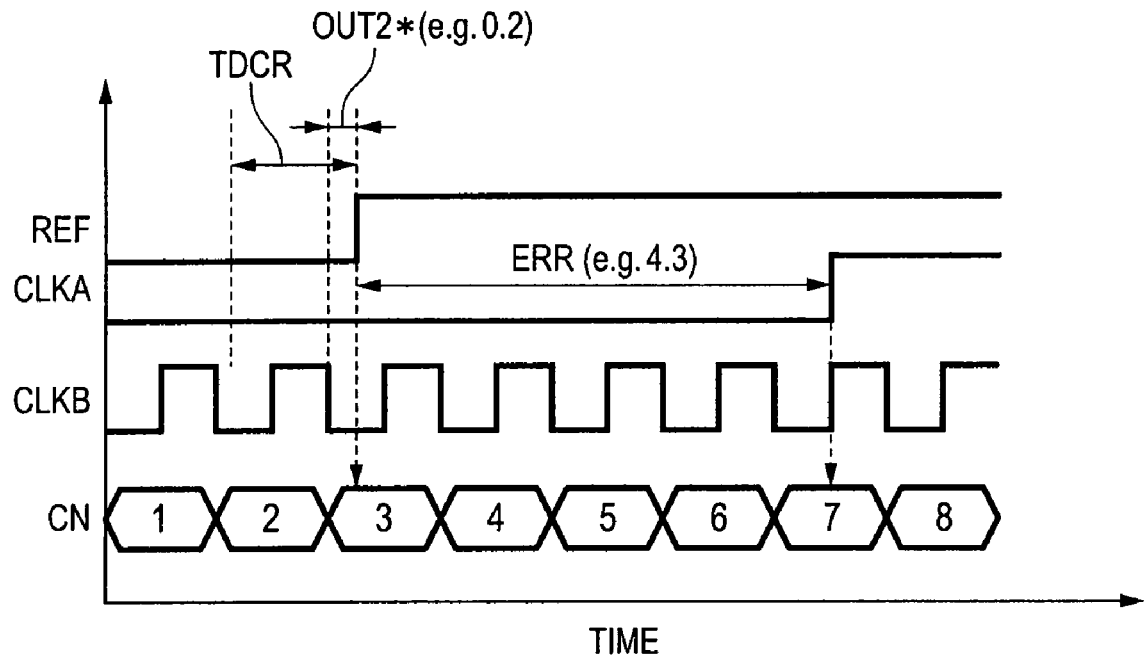
FIG. 7 is a waveform chart for explaining operation of the digital phase-frequency detector 2 in Mode 1.

FIG. 7 is a waveform chart for explaining the operation of the digital phase-frequency detector 2 in Mode 1. Beginning at the top, FIG. 7 illustrates a waveform of the reference clock signal REF, a waveform of the low frequency clock signal CLKA, a waveform of the high frequency clock signal CLKB, and an output signal CN (the number of counts of the high frequency clock signal CLKB) of the integrator 23 illustrated in FIG. 6. As illustrated in FIG. 7, it is assumed that the time difference ERR of a rising time between the reference clock signal REF and the low frequency clock signal CLKA is 4.3 cycles of the high frequency clock signal CLKB.

First, at the rising time of the reference clock signal REF, the number of counts CN of the high frequency clock signal CLKB which the first D flip-flop 24 of FIG. 6 holds is 3. Next, at the rising time of the low frequency clock signal CLKA, the number of counts CN of the high frequency clock signal CLKB which the second D flip-flop 25 of FIG. 6 holds is 7. Therefore, the time difference detected by the counter 16 of FIG. 6 becomes four cycles of the high frequency clock signal CLKB.

Next, in the case of FIG. 7, the high frequency clock signal CLKB rises after the reference clock signal REF rises, accordingly, a time difference OUT2* between the falling time of the high frequency clock signal CLKB and the rising time of the reference clock signal REF is detected by the time-to-digital converter 13 of FIG. 5. In the case of FIG. 7, the time difference OUT2* corresponds to 0.2 cycles of the high frequency clock signal CLKB. Therefore, the time difference between the rising time of the reference clock signal REF and the rising time of the high frequency clock signal CLKB becomes 0.3 cycles of the high frequency clock signal CLKB.

By the above, the time difference between the rising time of the reference clock signal REF and the rising time of the low frequency clock signal CLKA is calculated as 4.3 cycles, by adding four cycles of the output OUT1 of the counter 16 and 0.3 cycles of the output OUT2 of the time-to-digital converter 13. Here, in the case of the above-described example, it should be noticed about that the rising time or falling time of the low frequency clock signal CLKA is not within the detection range TDCR of the time-to-digital converter 13. Therefore, the time-to-digital converter 13 cannot detect a time difference between the rising time of the reference clock signal REF and the rising time of the low frequency clock signal CLKA directly.

Figure 8:
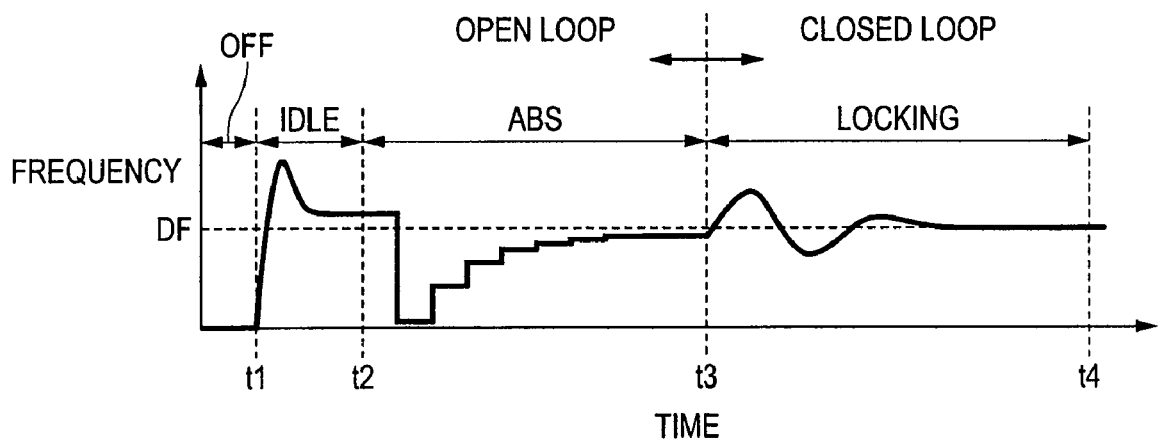
FIG. 8 is a drawing illustrating a frequency change of an output signal of the ADPLL circuit 1 in Mode 1.

FIG. 8 illustrates a frequency change of an output signal of the ADPLL circuit 1 in Mode 1. In FIG. 8, a power source is supplied to the ADPLL circuit 1 illustrated in FIG. 1 at time t1. A period from time t1 to time t2 is a standby time before an electronic circuit is activated.

From time t2 to time t3, an open loop control is performed to the digital controlled oscillator 4 illustrated in FIG. 1. For this reason, an auto band selection (ABS) circuit (not shown) is provided in the ADPLL circuit 1. The ABS circuit determines whether the low frequency clock signal CLKA is leading or delayed in phase compared with the reference clock signal REF. Based on the determination result, the ABS circuit selects an oscillation frequency band of the digital controlled oscillator 4 so that the digital controlled oscillator 4 may oscillate at frequency near the target frequency DF.

At time t3, a closed loop control according to Mode 1 is performed to the digital controlled oscillator 4. By the control, feedback is provided to the oscillating frequency of the digital controlled oscillator 4, and the oscillating frequency locks finally at time t4.

In this way, by adjusting the oscillating frequency of the digital controlled oscillator 4 to a frequency near the target frequency DF in the period from time t2 to time t3, it is possible to attain locking even if the gain of the digital controlled oscillator 4 is made small. As a result, it is possible to improve the phase noise characteristic of the ADPLL circuit 1.

Figure 9:
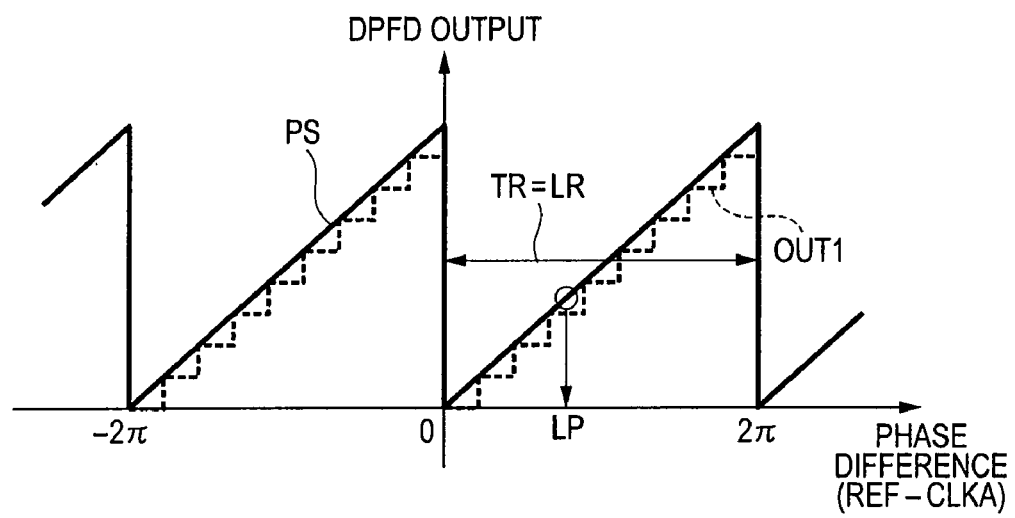
FIG. 9 is a drawing illustrating relation between the phase difference of an input signal and the output of the digital phase-frequency detector 2 in Mode 1.

FIG. 9 illustrates relation between the phase difference of the input signal and the output of the digital phase-frequency detector 2 in Mode 1. In FIG. 9, the horizontal axis shows the phase difference between the reference clock signal REF and the low frequency clock signal CLKA, and the vertical axis shows the magnitude of the output signal. Here, the phase difference between the reference clock signal REF and the low frequency clock signal CLKA is given by the difference of the rising time of the waveforms divided by a cycle of the reference clock signal REF and multiplied by $2\pi$.

As illustrated by a dashed line in FIG. 9, the relation between the output OUT1 of the counter 16 and the phase difference is stair-like. This is because the counter 16 detects the phase difference to an accuracy of a cycle of the high frequency clock signal CLKB. That is, although the phase detection range of the counter 16 is wider than the phase detection range of the time-to-digital converter 13, the resolution of the counter 16 is lower than the resolution of the time-to-digital converter 13.

On the other hand, as illustrated by a solid line in FIG. 9, the relation between the output signal PS of the digital phase-frequency detector 2 and the phase difference is linear like a straight line in the region of $0$-$2\pi$. This is because the large phase detection range which the counter 16 has and the high resolution which the time-to-digital converter 13 has can be both maintained by performing parallel operation of the counter 16 and the time-to-digital converter 13.

In FIG. 9, when the frequency locks, the phase difference becomes a fixed value. In Mode 1, the phase difference in a lock point LP is approximately zero.

In order for the PLL circuit to lock at a desired frequency, a certain amount of the phase detection range is required. This phase detection range of the PLL circuit is called a locking range LR. Since the output characteristic of the digital phase-frequency detector 2 illustrated in FIG. 9 is linear in the region of 0-2π, the locking range LR is the region of 0-2π.

The locked frequency may change after once a locking is established. In order to keep the locking by tracking the frequency change in such a case, a certain amount of the phase detection range is required. This region is called a tracking range TR. In Mode 1 of FIG. 9, the tracking range TR is 0-2π, and equal to the locking range LR.

In performing direct modulation of an ADPLL circuit 1 for communication apparatuses, an oscillating frequency of the ADPLL circuit 1 changes. In a fractional-N PLL synthesizer which enables an oscillating frequency to change continuously with an equivalently non-integral dividing ratio by use of a ΔΣ-modulation etc., frequencies of the low frequency clock signal CLKA and the high frequency clock signal CLKB which are outputted from the divider 5 change. In such a case, a PLL circuit with a wide tracking range TR is required; therefore, the ADPLL circuit 1 of the operation mode of Mode 1 is employed.

(Mode 2: Power Saving Mode)

Next, operation of the ADPLL circuit 1 in Mode 2 is explained. As explained with reference to FIG. 3, in Mode 2, a period required for the ADPLL circuit 1 to establish a locking is divided into a coarse adjustment period and a fine adjustment period.

Figure 10:
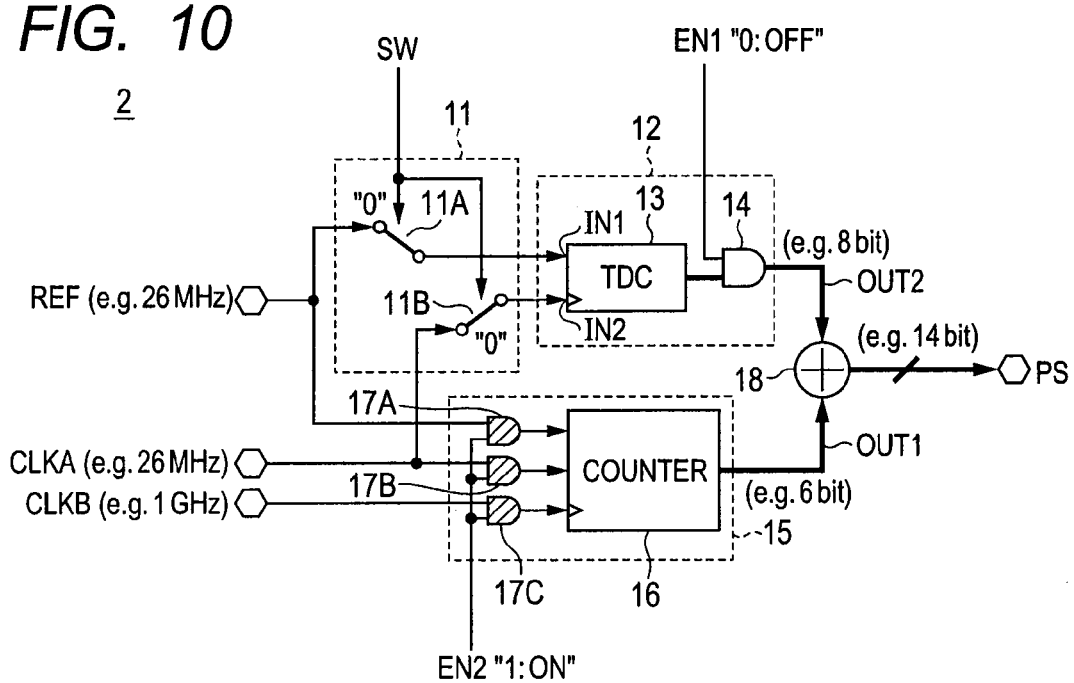
FIG. 10 is a block diagram for explaining operation of the digital phase-frequency detector 2 in a coarse adjustment period in Mode 2.

FIG. 10 is a block diagram for explaining operation of the digital phase-frequency detector 2 in a coarse adjustment period in Mode 2.

As illustrated in FIG. 10, in the coarse adjustment period of Mode 2, the control signal SW is set as "0", therefore, the reference clock signal REF is inputted into the first input node IN1 of the time-to-digital converter 13 via the first switch 11A. In addition, the low frequency clock signal CLKA is inputted into the second input node IN2 of the time-to-digital converter 13 via the second switch 11B.

The time-to-digital converter 13 detects the phase difference between the reference clock signal REF and the low frequency clock signal CLKA which are inputted. However, since the enable signal EN1 is in a non-active state ("0") during the coarse adjustment period, the output of the time-to-digital converter 13 is not supplied to the adder 18.

On the other hand, in the coarse adjustment period of Mode 2, the enable signal EN2 is in an active state ("1"), therefore, the reference clock signal REF, the low frequency clock signal CLKA, and the high frequency clock signal CLKB are inputted into the counter 16 via the AND circuits 17A, 17B, and 17C respectively. The counter 16 detects a time difference between a rising time of the reference clock signal REF and a rising time of the low frequency clock signal CLKA, and outputs the signal OUT1 corresponding to the detected time difference to the adder 18. In this way, in the coarse adjustment period of Mode 2, the phase difference signal PS is outputted from the digital phase-frequency detector 2, according only to the detection result obtained by the counter 16.

Figure 11:
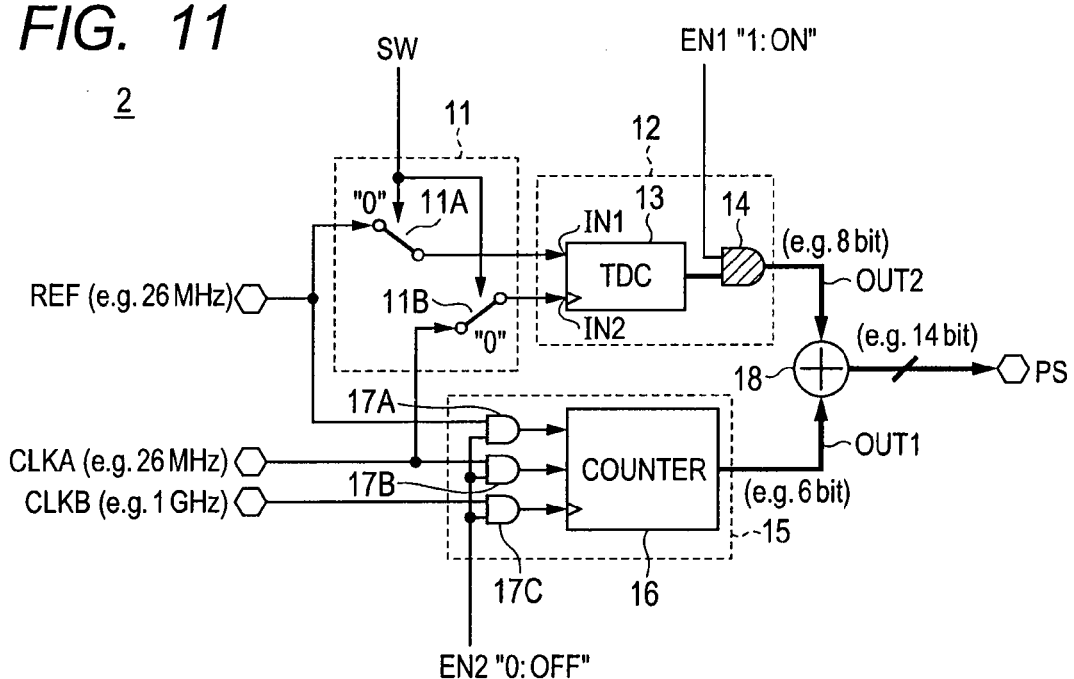
FIG. 11 is a block diagram for explaining operation of the digital phase-frequency detector 2 in a fine adjustment period in Mode 2.

FIG. 11 is a block diagram for explaining operation of the digital phase-frequency detector 2 in a fine adjustment period in Mode 2.

As illustrated in FIG. 11, in the fine adjustment period of Mode 2, the control signal SW is set as "0", therefore, the reference clock signal REF is inputted into the first input node IN1 of the time-to-digital converter 13 via the first switch 11A. In addition, the low frequency clock signal CLKA is inputted into the second input node IN2 of the time-to-digital converter 13 via the second switch 11B.

The time-to-digital converter 13 detects a time difference between a rising time of the reference clock signal REF and a rising time of the low frequency clock signal CLKA which are inputted. Since the enable signal EN1 is in an active state ("1") during the fine adjustment period, the signal OUT2 corresponding to the detected time difference is outputted to the adder 18.

On the other hand, in the fine adjustment period of Mode 2, the enable signal EN2 is in a non-active state ("0"), therefore, the signals inputted into the counter 16 via the AND circuits 17A, 17B, and 17C are "0", and the output OUT1 of the counter 14 does not change in the meantime. Therefore, in the fine adjustment period of Mode 2, the phase difference signal PS is outputted from the digital phase-frequency detector 2 based on the detection result OUT2 obtained by the time-to-digital converter 13.

Figure 12A:
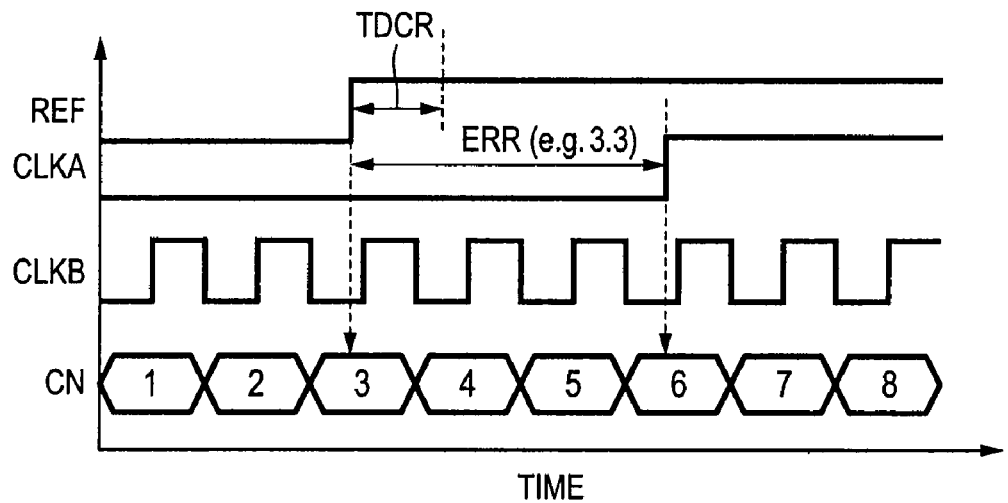
FIG. 12 (A) is a waveform chart for explaining operation of the digital phase-frequency detector 2 in Mode 2.
Figure 12B:
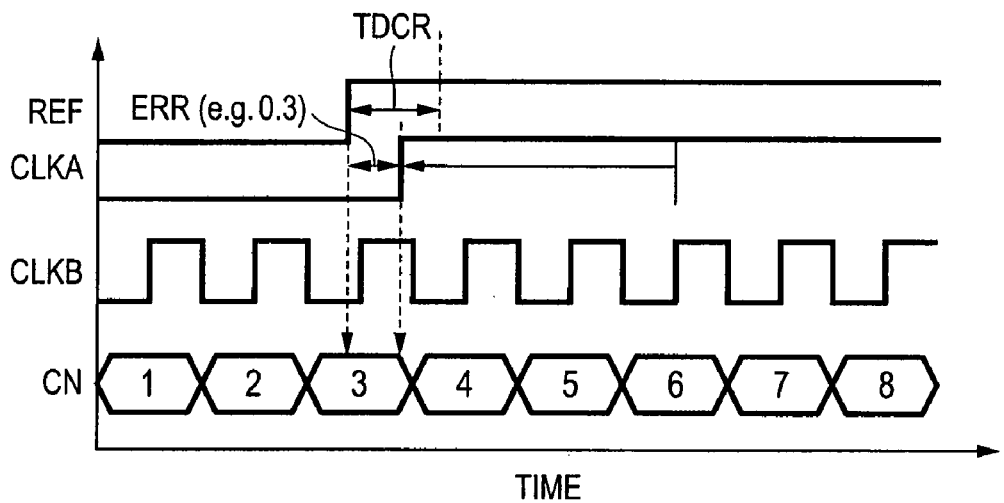
Figure 12C:
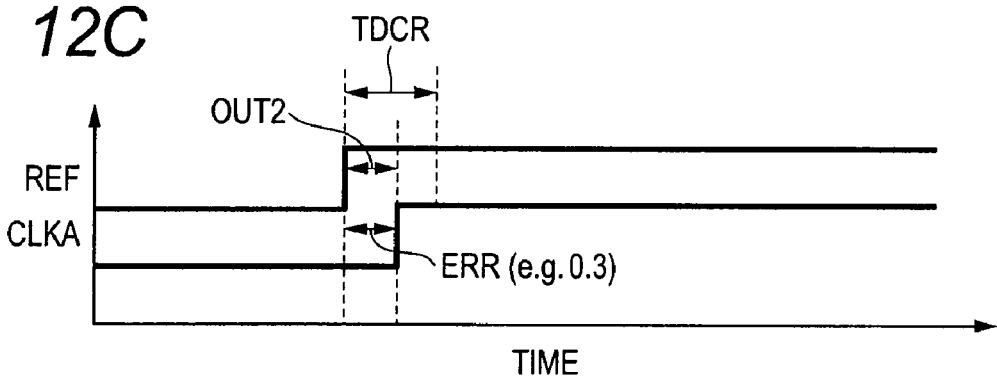

FIG. 12 (A) is a waveform chart for explaining operation of the digital phase-frequency detector 2 in Mode 2. FIG. 12 (B) is another waveform chart for explaining operation of the digital phase-frequency detector 2 in Mode 2. FIG. 12 (C) is a further another waveform chart for explaining operation of the digital phase-frequency detector 2 in Mode 2.

FIG. 12 (A) illustrates the coarse adjustment period. Beginning at the top, FIG. 12 (A) illustrates a waveform of the reference clock signal REF, a waveform of the low frequency clock signal CLKA, a waveform of the high frequency clock signal CLKB, and an output signal CN (number of counts of the high frequency clock signal CLKB) of the integrator 23 illustrated in FIG. 6. As illustrated in FIG. 12 (A), it is assumed that the time difference ERR of the rising time between the reference clock signal REF and the low frequency clock signal CLKA is 3.3 cycles of the high frequency clock signal CLKB.

First, the number of counts CN of the high frequency clock signal CLKB which the first D flip-flop 24 of FIG. 6 holds to the rising time of the reference clock signal REF is three. Next, the number of counts CN of the high frequency clock signal CLKB which the second D flip-flop 25 of FIG. 6 holds to the rising time of the low frequency clock signal CLKA is six. Therefore, the time difference detected by the counter 16 of FIG. 6 is equal to three cycles of the high frequency clock signal CLKB.

FIG. 12 (B) illustrates the time of shift from the coarse adjustment period to the fine adjustment period. As illustrated in FIG. 12 (B), as a result of feedback applied to the output of the counter 16 in the coarse adjustment period, the phase difference between the reference clock signal REF and the low frequency clock signal CLKA, which is detected by the counter 16, is zero. As a result, the rising edge of the low frequency clock signal CLKA enters in the time detection range TDCR of the time-to-digital converter 13; therefore, the phase difference detection by the time-to-digital converter 13 becomes possible. The DPFD controller 7 of FIG. 1 changes the enable signals EN1 and EN2 so as to shift from the coarse adjustment period to the fine adjustment period, when the DPFD controller 7 detects that the phase difference signal PS currently monitored has reached the reference value (it is zero in the case of FIG. 12 (B)).

FIG. 12 (C) illustrates the fine adjustment period. Beginning at the top, FIG. 12 (C) illustrates a waveform of the reference clock signal REF, and a waveform of the low frequency clock signal CLKA. In FIG. 12 (C), the time difference ERR of a rising time between the reference clock signal REF and the low frequency clock signal CLKA is 0.3 cycles of the high frequency clock signal CLKB. The time-to-digital converter 13 detects this time difference ERR, and outputs the time difference OUT2 detected to the adder 18.

When the frequency finally locks, the time difference ERR of FIG. 12 (C) becomes a steady value. This time difference ERR when the locking is established can be set by subtracting an arbitrary value (0.3 in the case of FIG. 12 (C) for example) from the output of TDC13 beforehand. Such control maybe performed when it is necessary to avoid overlapping of the rising edge of the low frequency clock signal CLKA and the rising edge of the reference clock signal REF when the locking is established.

Figure 13:
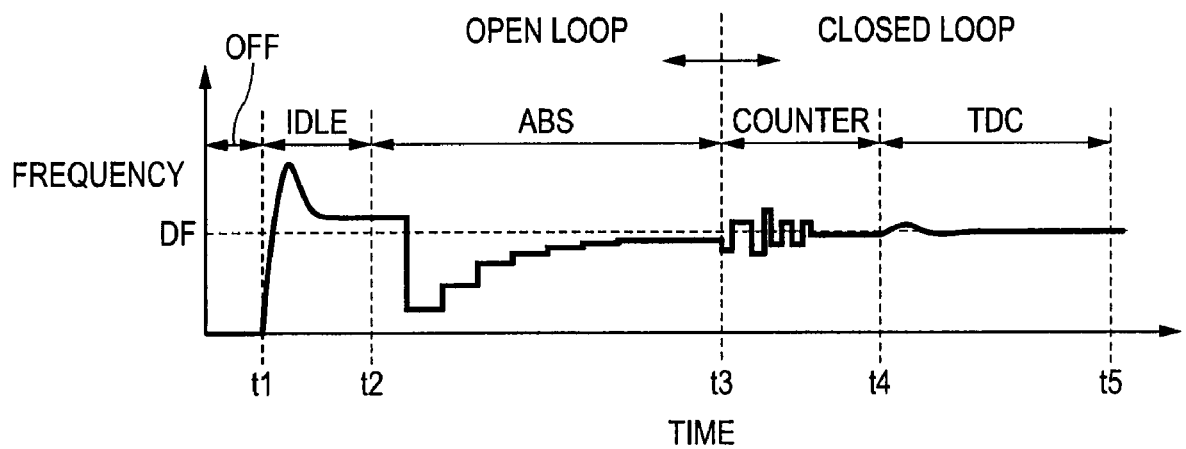
FIG. 13 illustrates a frequency change of the output signal of the ADPLL circuit 1 in Mode 2.

FIG. 13 illustrates a frequency change of the output signal of the ADPLL circuit 1 in Mode 2.

In FIG. 13, time t1-t3 is the same as in FIG. 8; therefore, duplicated explanation will not be repeated. After time t3 of FIG. 13, a closed loop control according to the operation mode of Mode 2 is performed. Time t3-t4 corresponds to the coarse adjustment period. During the present period, a closed loop control of the digital controlled oscillator 4 is performed, based on the phase difference between the reference clock signal REF and the low frequency clock signal CLKA, which is detected by the counter 16.

A period subsequent to time t4 corresponds to the fine adjustment period. In the period, a closed loop control of the digital controlled oscillator 4 is performed, based on the phase difference between the reference clock signal REF and the low frequency clock signal CLKA, which is detected by the time-to-digital converter 13. As a result, at time t5, the oscillating frequency of the digital controlled oscillator 4 becomes equal to the target frequency DF and locks.

Figure 14:
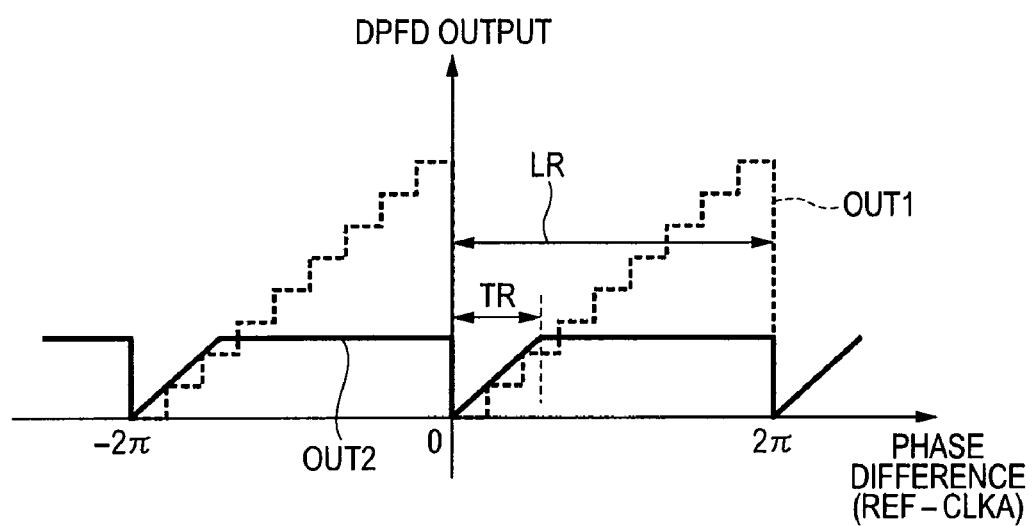
FIG. 14 is a drawing illustrating relation between the phase difference of an input signal and the output of the digital phase-frequency detector 2 in Mode 2.

FIG. 14 illustrates relation between the phase difference of the input signal and the output of the digital phase-frequency detector 2 in Mode 2. In FIG. 14, the horizontal axis shows the phase difference between the reference clock signal REF and the low frequency clock signal CLKA, and the vertical axis shows the magnitude of the output signal.

In the coarse adjustment period of Mode 2, detection of the phase difference is performed by only the counter 16. Therefore, as illustrated by the dashed-line graph (OUT1) of FIG. 14, the locking range LR is as large as 0-2π, but the resolution is low. On the other hand, in the fine adjustment period of Mode 2, detection of the phase difference is performed by only the time-to-digital converter 13. Therefore, as illustrated by the solid-line graph (OUT2) of FIG. 14, the resolution is higher than the dashed-line graph, but the linear range becomes narrower.

When the graph of Mode 2 illustrated in FIG. 14 is compared with the graph of Mode 1 illustrated in FIG. 9, the locking range LR in Mode 2 is the same as that in Mode 1. On the other hand, the tracking range TR in Mode 2 becomes narrower than that in Mode 1.

Since the tracking range TR is narrow, the ADPLL circuit 1 of Mode 2 is not suitable in the case of performing direct modulation of the PLL circuit. However, the ADPLL circuit 1 of Mode 2 can be used satisfactorily in the case of a receiver etc. which employs a fixed oscillating frequency. Furthermore, as will be described below, the ADPLL circuit 1 operating in Mode 2 has less current consumption than operating in Mode 1; accordingly, the ADPLL circuit 1 operating in Mode 2 is more suitable for use in a receiver etc. than the ADPLL circuit 1 operating in Mode 1.

Figure 15:
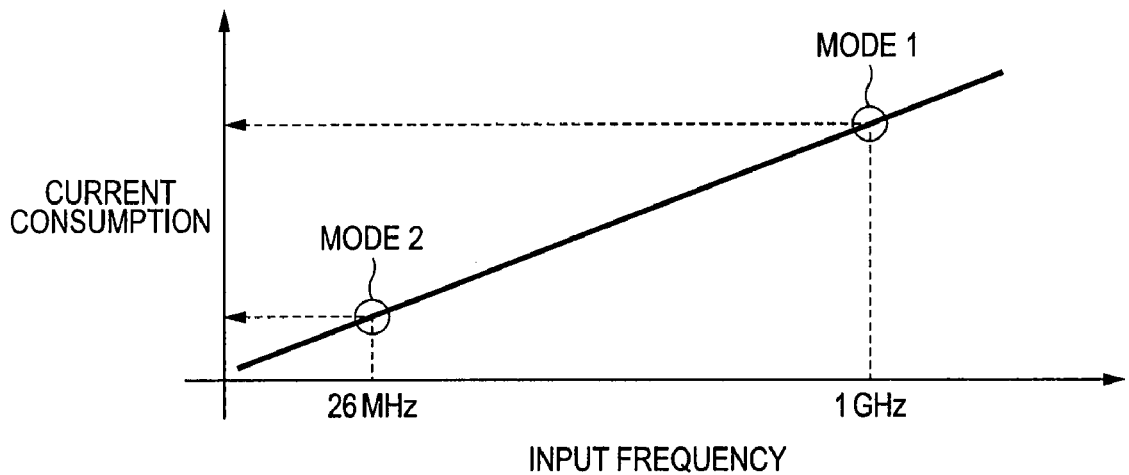
FIG. 15 is a drawing illustrating relation between frequency of an input signal and current consumption of the ADPLL circuit 1.

FIG. 15 illustrates relation between frequency of an input signal and current consumption of the ADPLL circuit 1. It is thinkable that current consumption of the ADPLL circuit 1 depends on frequency of a signal inputted into the digital phase-frequency detector 2 of FIG. 2. In Mode 1, the high frequency clock signal CLKB (for example, 1 GHz) is inputted into both of the counter 16 and the time-to-digital converter 13 illustrated in FIG. 2.

On the other hand, in Mode 2, the high frequency clock signal CLKB (for example, 1 GHz) is temporarily inputted into the counter 16 only in the coarse adjustment period. However, into the time-to-digital converter 13 which operates after the fine adjustment period, only the reference clock signal REF (for example, 26 MHz) and the low frequency clock signal CLKA (for example, 26 MHz) are inputted. Therefore, by operating the ADPLL circuit 1 in Mode 2, current consumption can be reduced, compared with the case of Mode 1 in which a high frequency signal is always inputted into the digital phase-frequency detector 2.

Figure 16:
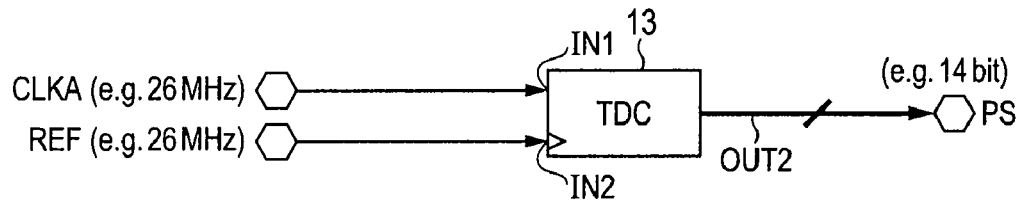
FIG. 16 is a block diagram illustrating configuration of a digital phase comparator 502 as a comparative example of the digital phase-frequency detector 2 illustrated in FIG. 2.

Furthermore, the ADPLL circuit 1 according to Embodiment 1 has an effect of reduction of the circuit area. FIG. 16 is a block diagram illustrating configuration of a digital phase comparator 502 as a comparative example of the digital phase-frequency detector 2 illustrated in FIG. 2. The digital phase-frequency detector 502 illustrated in FIG. 16 includes only a time-to-digital converter 13. This point is different from the digital phase-frequency detector 2 illustrated in FIG. 2. The configuration of the time-to-digital converter 13 is the same as is illustrated in FIG. 5. In FIG. 16, the low frequency clock signal CLKA is inputted into the first input node IN1 of the time-to-digital converter 13, and the reference clock signal REF is inputted into the second input node IN2.

In the digital phase-frequency detector 502 including only the time-to-digital converter 13, in order to realize the resolution (for example, 20 picoseconds) and the detection range which are equivalent to those of the digital phase-frequency detector 2 of Mode 1, ten thousands or more stages of delay cells are required. For this reason, the circuit area concerned becomes huge and causes a problem.

Figure 17:
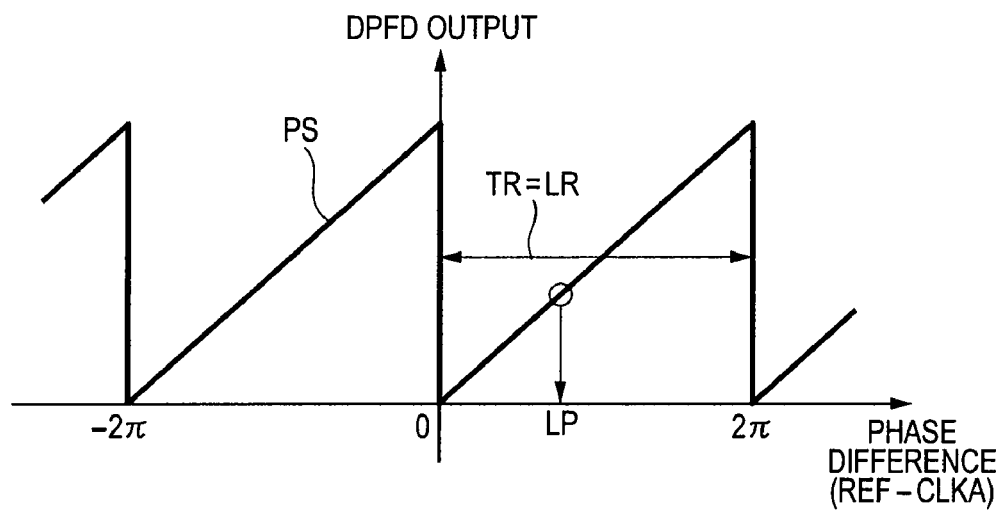
FIG. 17 is a drawing illustrating relation between the phase difference of an input signal and the output of the digital phase comparator 502 illustrated in FIG. 16.

FIG. 17 illustrates relation between the phase difference of the input signal and the output of the digital phase comparator 502 illustrated in FIG. 16. When the case of FIG. 17 is compared with the case of the ADPLL circuit 1 of Mode 1 illustrated in FIG. 9, the locking range LR and the tracking range TR of the case of FIG. 17 are the same as the case of FIG. 9. In this way, the digital phase-frequency detector 2 illustrated in FIG. 2 has realized the same performance as the digital phase-frequency detector 502 illustrated in FIG. 16 with a smaller circuit area.

The effect of the ADPLL circuit 1 according to Embodiment 1 is now summarized as follows. First, by operating the ADPLL circuit 1 in Mode 2, it is possible to realize low power consumption. Since the locking range in Mode 2 is not different from the locking range in Mode 1, the locking performance does not deteriorate due to the low power consumption.

Second, when a wide tracking range is required like in a case of performing direct modulation of the PLL circuit without providing a quadrature modulator, the case is well coped with by operating the ADPLL circuit 1 in Mode 1. The change of the operation mode from Mode 2 to Mode 1 can be easily made by the change of the control signal SW and the enable signals EN1 and EN2.

Third, by sharing the counter 16 and the time-to-digital converter 13, the required area can be reduced compared with a case where the digital phase-frequency detector is formed only by the time-to-digital converter 13. Since the change of the operation mode can be easily made by the change of the control signal SW and the enable signals EN1 and EN2, when a circuit which needs a high tracking range and a circuit which needs a reduction of current consumption do not operate simultaneously, a PLL circuit employed in these circuits can be shared. As a result, plural PLL circuits required in the conventional case can be replaced by one PLL circuit; therefore, the circuit areas are reducible.

(Example of Application of ADPLL Circuit 1 to a Wireless Communication Apparatus)

In recent years, the mobile-phone needs to support various wireless communication specifications, such as WCDMA (Wideband Code Division Multiple Access), GSM (Global System for Mobile Communications), EDGE (Enhanced Data GSM Environment), etc. For this reason, there is an increasing need of replacing a portion of RF-IC mounted so far by an analog circuit with a digital circuit. By replacing to a digital circuit, reduction of circuit areas, reduction of an operating voltage, variation control of an element characteristic, etc. can be expected.

Also as for a PLL synthesizer, the case where an ADPLL of which all the passive elements are replaced to digital circuits is adopted as a product is increasing. However, such an ADPLL needs to perform digital processing of a signal of several GHz; therefore a problem is that the current consumption becomes large. The ADPLL circuit 1 explained above has the advantage that it is possible to realize low power consumption and at the same time to attain reduction of circuit areas, compared with PLL synthesizers in the past. The following explains an example of application of the ADPLL circuit 1 to a mobile-phone.

Figure 18:
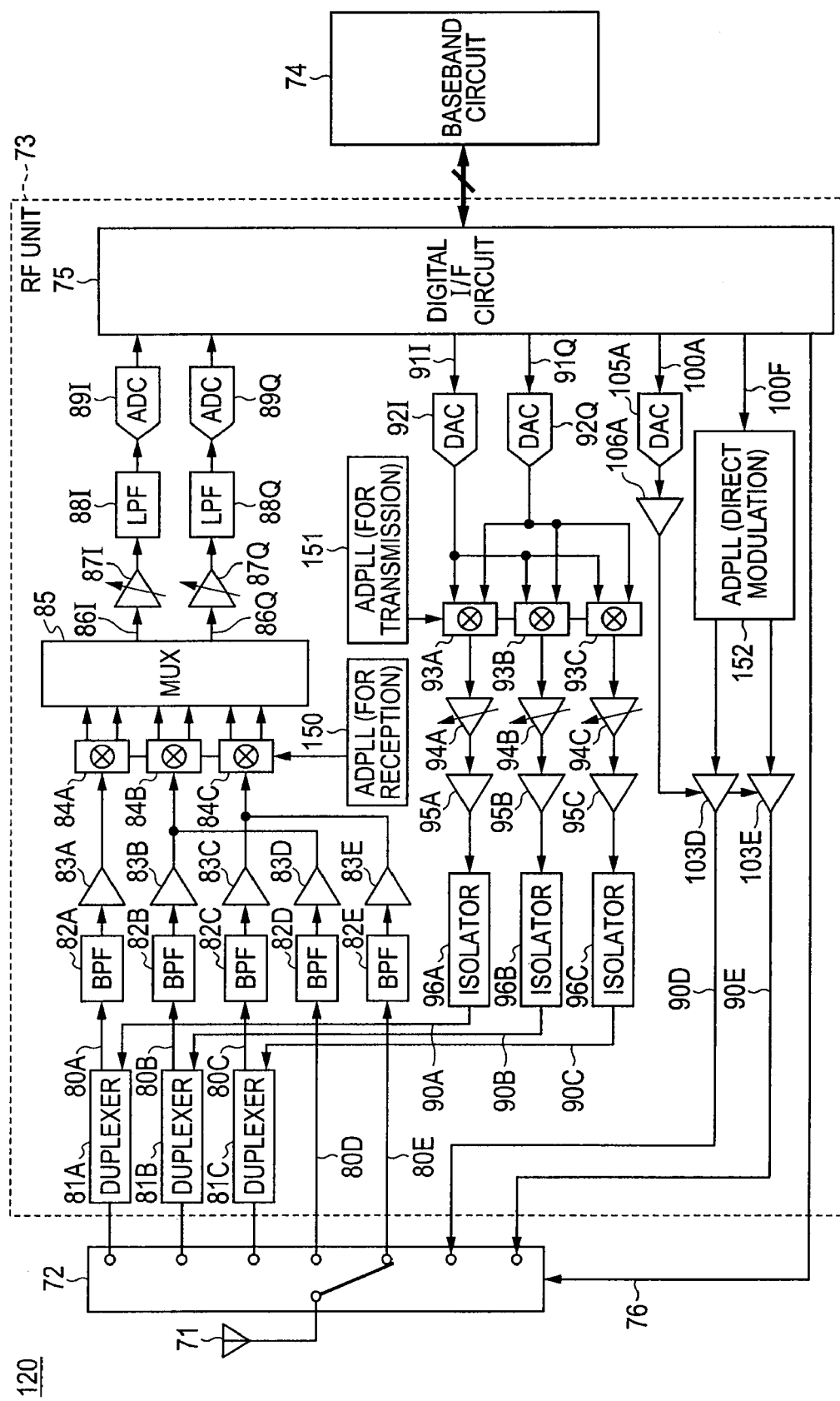
FIG. 18 is a block diagram illustrating configuration of a mobile-phone 120 as an example of application of the ADPLL circuit 1 illustrated in FIG. 1.

FIG. 18 is a block diagram illustrating configuration of a mobile-phone 120 as an example of application of the ADPLL circuit 1 illustrated in FIG. 1. As illustrated in FIG. 18, the mobile-phone 120 includes an antenna element 71, an antenna switch 72, an RF unit 73, and a baseband circuit 74. The mobile-phone 120 is the so-called multiband terminal supporting each communication system of WCDMA, GSM, and EDGE.

Specifically, in WCDMA, the mobile-phone 120 supports the frequency bands of Band 1 (reception: 2110-2170 MHz, transmission: 1920-1980 MHz), Band 2 (reception: 1930-1990 MHz, transmission: 1850-1910 MHz), and Band 5 (reception: 869-894 MHz, transmission: 824-849 MHz).

In GSM, the mobile-phone 120 supports the frequency bands of GSM850 (reception: 869-894 MHz, transmission: 824-849 MHz), GSM900 (reception: 925-960 MHz, transmission: 880-915 MHz), DCS1800 (reception: 1805-1880 MHz, transmission: 1710-1785 MHz), and PCS1900 (reception: 1930-1990 MHz, transmission: 1850-1910 MHz). Here, DCS stands for Digital Cellular System, and PCS stands for Personal Communication System.

EDGE is the extended system of GSM and uses the same frequency bands as GSM. GMS employs a GMSK (Gaussian Minimum Shift Keying) modulation; in contrast, EDGE employs a GMSK modulation for voice communication and an 8-PSK (Phase Shift Keying) modulation for data communication.

In order to share the antenna element 71 by the communication system of each of above-described frequency bands, the antenna switch 72 is provided. Since GSM/EDGE is a half-duplex communication system, the antenna switch 72 changes connection in transmission and in reception. On the other hand, since WCDMA is a full-duplex communication system in which transmission and reception are carried out simultaneously in two frequency bands, the antenna switch 72 does not changed connection in transmission and in reception. The antenna switch 72 changes connection according to a switching signal 76 supplied from the baseband circuit 74 via a digital interface circuit 75.

The RF unit 73 performs frequency conversion of RF reception signals 80A-80E received by the antenna element 71 to baseband signals 86I and 86Q. In this case, a PLL frequency synthesizer 150 illustrated in FIG. 18 is employed as a local oscillator for quadrature demodulators 84A-84C. The baseband signals 86I and 86Q are converted into a digital signal, and subsequently outputted to the baseband circuit 74 via the digital interface circuit 75 provided in the RF unit 73.

In FIG. 18, the reception signal 80A is a signal of Band 1 of WCDMA, the reception signal 80B is a signal of Band 2 of WCDMA, and the reception signal 80C is a signal of Band 5 of WCDMA, respectively. The reception signal 80D is a signal of the band of DCS1800/PCS1900, and the reception signal 80E is a signal of the band of GSM850/GSM950. In the mobile-phone 120, a direct conversion system is employed, in which direct conversion of the reception signals 80A-80E to the baseband signals 86I and 86Q is performed without converting them into an intermediate frequency.

Furthermore, the RF unit 73 converts, into RF transmitting signals 90A-90E, the modulating signals 91I, 91Q, 100A, and 100F which the baseband circuit 74 generates based on transmitting data. In FIG. 18, the transmitting signal 90A is a signal of Band 1 of WCDMA, the transmitting signal 90B is a signal of Band 2 of WCDMA, and the transmitting signal 90C is a signal of Band 5 of WCDMA, respectively. The transmitting signal 90D is a signal of the band of DCS1800/PCS1900, and the transmitting signal 90E is a signal of the band of GSM850/GSM950. Each of the transmitting signals 90A-90E is transmitted towards a base station from the antenna element 71.

In the case of the mobile-phone 120, a modulation method differs in the GSM/EDGE system and in the WCDMA system. The GSM/EDGE system employs a polar modulation system which performs direct modulation of a PLL frequency synthesizer 152. On the other hand, the WCDMA system employs a PLL frequency synthesizer 151 as a local oscillator, and modulation is carried out by quadrature modulators 93A, 93B, and 93C. In this case, a direct conversion system is employed as is the case with the frequency conversion of the reception signals 80A-80C, that is, the modulating signals 91I and 91Q are directly converted into RF transmitting signals 90A, 90B, and 90C without being converted into an intermediate frequency.

Hereafter, an outline is explained about each component of the RF unit 73, illustrated in FIG. 18. First, configuration of a receiving circuit is explained.

The RF unit 73 includes, as the configuration of the receiving circuit, duplexers 81A-81C, band-pass filters 82A-82E each of which passes a frequency band corresponding to each of the reception signals 80A-80E, and low-noise amplifiers 83A-83E which amplify signals filtered by the band-pass filters 82A-82E, respectively. Corresponding to the WCDMA system which performs the full-duplex transmission, duplexers 81A-81C are provided between the antenna switch 72 and the band-pass filters 82A-82C. The duplexers 81A, 81B, and 81C separate a path of a transmitting signal and a path of a reception signal, in order to share an antenna in transmission and in reception.

The RF units 73 further includes the quadrature demodulators 84A-84C, the PLL frequency synthesizer 150, a multiplexer 85, programmable gain amplifiers 87I and 87Q, low pass filters 88I and 88Q, and A/D (Analog-to-Digital) converters 89I and 89Q.

The quadrature demodulators 84A-84C are provided respectively corresponding to Band 1, Band 2, and Band 5 of WCDMA, and perform frequency conversion of the reception signals 80A-80C to a baseband signal. The quadrature demodulator 84B also performs frequency conversion of the reception signal 80D corresponding to DCS1800/PCS1900. The quadrature demodulator 84C also performs frequency conversion of the reception signal 80E corresponding to GSM850/GSM950. The PLL frequency synthesizer 150 is provided as a local oscillator for the quadrature demodulator 84A-84C. Each quadrature demodulator outputs a baseband I signal and a baseband Q signal which are obtained by the frequency conversion.

The multiplexer 85 is a selector switch for selecting a quadrature demodulator corresponding to a frequency band under communication among the quadrature demodulators 84A-84C. The I signal 86I and the Q signal 86Q which are outputted from the multiplexer 85 are adjusted in magnitude by the programmable gain amplifiers 87I and 87Q. After the magnitude adjustment, the I signal and the Q signal pass through the low pass filters 88I and 88Q, and are converted into a digital signal by the A/D converters 89I and 89Q. The I signal and the Q signal after the digital conversion are outputted to the baseband circuit 74 via the digital interface circuit 75. The baseband circuit 74 demodulates the transmitted data based on the I signal and the Q signal.

Next, configuration of a transmitting circuit in the case of the WCDMA system is explained. The RF unit 73 includes, as the configuration of the transmission circuit of the WCDMA system, D/A (Digital-to-Analog) converters 92I and 92Q, the quadrature modulators 93A-93Q, programmable gain amplifiers 94A-94Q, power amplifiers 95A-95C, isolators 96A-96C, and the PLL frequency synthesizer 151. The quadrature modulators 93A-93C are provided respectively corresponding to Band 1, Band 2, and Band 5. The programmable gain amplifiers 94A-94C, the power amplifiers 95A-95C, and the isolators 96A-96C are also provided respectively corresponding to Band 1, Band 2, and Band 5.

Corresponding to the WCDMA system, the baseband circuit 74 generates an I signal and a Q signal (modulating signal) of which the phase is orthogonally oriented with each other, based on transmitting data. The I signal 91I and the Q signal 91Q inputted via the digital interface circuit 75 are converted into analog signals by the D/A converters 92I and 92Q, respectively. The I signal 91I and the Q signal 91Q after the analogue conversion are outputted to a quadrature modulator corresponding to a frequency band used among the quadrature modulators 93A-93C.

Each quadrature modulator modulates an oscillation output of the PLL frequency synthesizer 151 with the I signal and the Q signal. The PLL frequency synthesizer 151 is provided as a local oscillator for each quadrature modulator.

The signals outputted from the quadrature modulators 93A-93C are adjusted in magnitude by the programmable gain amplifiers 94A-94C respectively, and then amplified by the power amplifiers 95A-95C, respectively. The signals outputted from the power amplifiers 95A-95C pass through the isolators 96A-96C and the duplexers 81A-81C, respectively, and are transmitted from the antenna element 71 as the transmitting signals 90A-90C.

Next, configuration of a transmitting circuit in the case of GSM/EDGE system is explained. The RF unit 73 includes, as the transmission circuit of the GSM/EDGE system, the PLL frequency synthesizer 152, power amplifiers 103D and 103E, a D/A converter 105A, and an amplifier 106A. The power amplifier 103D is provided corresponding to the frequency band of DCS1800/PCS1900, and the power amplifier 103E is provided corresponding to the frequency band of GSM850/GSM950.

In the case of the GSM/EDGE system, the transmitting signals 90D and 90E are generated by polar modulation. In this case, the baseband circuit 74 generates an I signal and a Q signal (modulating signals) based on transmitting data. The baseband circuit 74 converts the I signal and the Q signal generated on rectangular coordinates into an amplitude-modulated signal and a phase-modulated signal on a polar coordinate plane. The amplitude-modulated signal and the phase-modulated signal generated are outputted to the digital interface circuit 75 of the RF unit 73.

The amplitude-modulated signal 100A is converted into an analog signal by the D/A converter 105A, and then adjusted in magnitude by the amplifier 106A. The amplitude-modulated signal 100A after the magnitude adjustment modulates a power supply voltage of the power amplifiers 103D and 103E.

The phase-modulated signal 100F is used for performing direct modulation of the PLL frequency synthesizer 152. Specifically, a dividing ratio of a divider provided in the PLL frequency synthesizer is modulated corresponding to the phase-modulated signal 100F. A signal generated by the PLL frequency synthesizer 152 is outputted to the power amplifier 103D or 103E corresponding to the frequency band.

The power amplifiers 103D and 103E amplify the signal outputted from the PLL frequency synthesizer 152. Since the power supply voltage which drives the power amplifiers 103D and 103E is modulated by the amplitude-modulated signal 100A at this time, the transmitting signals 90D and 90E which are finally modulated by the amplitude-modulated signal 100A and the phase-modulated signal 100F are emitted from the antenna element 71.

The ADPLL circuit 1 illustrated in FIG. 1 is applicable to all of the PLL frequency synthesizers 150, 151, and 152, explained until now. When explained specifically, the oscillating frequency of the PLL frequency synthesizer 150 employed as the local oscillator for reception is set as the frequency of the telecommunications standard to utilize, accordingly, the tracking range of the synthesizer 150 may be narrow. Therefore, the ADPLL circuit 1 of the operation mode of Mode 2 (power saving mode) can be employed for the PLL frequency synthesizer 150. By the employment, a current consumption of the PLL frequency synthesizer 150 can be reduced more than the past.

The oscillating frequency of the PLL frequency synthesizer 151 employed as the local oscillator for transmission of the WCDMA system is also set as the frequency of the telecommunications standard to utilize. Therefore, the ADPLL circuit 1 of the operation mode of Mode 2 (power saving mode) can be employed for the PLL frequency synthesizer 151. As a result, a current consumption of the PLL frequency synthesizer can be reduced more than the past.

The PLL frequency synthesizer 152 employed for transmission of the GSM/EDGE system is directly modulated by the modulating signal (the phase-modulated signal 100F). For this reason, the ADPLL circuit 1 of the operation mode of Mode 1 (high tracking range mode) with a wider tracking range is employed.

In this way, the same ADPLL circuit 1 can be applied also to all the PLL frequency synthesizers in the RF unit 73; accordingly, a work load of circuit design can be reduced.

Figure 19:
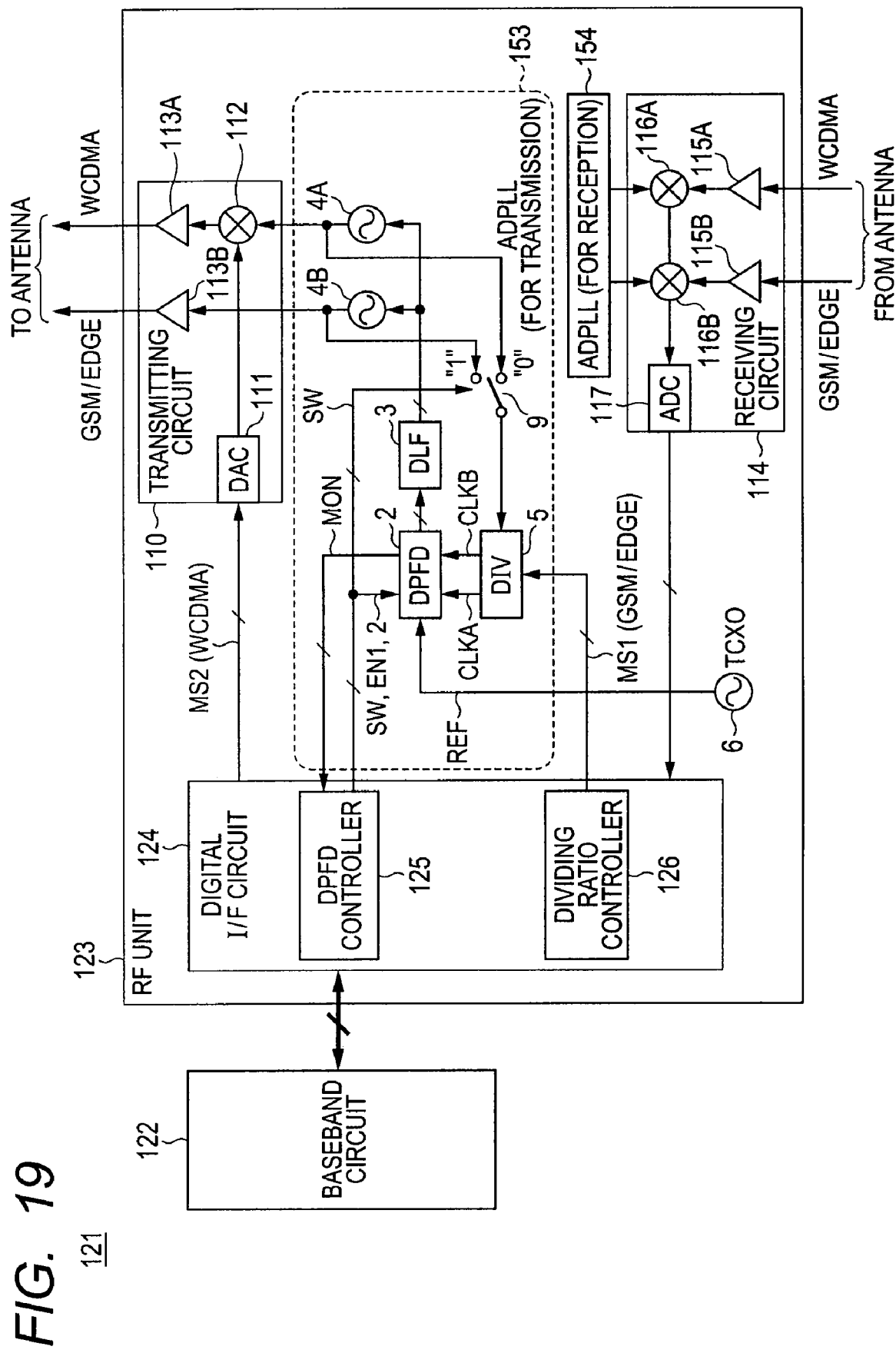
FIG. 19 is a block diagram illustrating configuration of a mobile-phone 121 as another example of application of the ADPLL circuit 1 illustrated in FIG. 1.

FIG. 19 is a block diagram illustrating configuration of a mobile-phone 121 as another example of application of the ADPLL circuit 1 illustrated in FIG. 1. In the mobile-phone 121 illustrated in FIG. 19, the PLL frequency synthesizers 151 and 152 for transmission illustrated in FIG. 18 are united into one PLL frequency synthesizer 153. The ADPLL circuit 1 illustrated in FIG. 1 is modified and employed for the PLL frequency synthesizer 153. The PLL frequency synthesizer 153 is used by switching its operation mode to Mode 1 (high tracking range mode) or to Mode 2 (power saving mode). A specific explanation is given in the following.

The mobile-phone 121 illustrated in FIG. 19 includes a baseband circuit 122 and an RF unit 123. The RF unit 123 includes PLL frequency synthesizers 153 and 154, a digital interface circuit 124, a transmitting circuit 110, a receiving circuit 114, and a temperature compensated crystal oscillator 6.

The PLL frequency synthesizer 153 differs from the ADPLL circuit 1 illustrated in FIG. 1 in that two digital controlled oscillators 4A and 4B are included instead of a single digital controlled oscillator 4. The digital controlled oscillator 4A is provided for WCDMA, and the digital controlled oscillator 4B is provided for GSM/EDGE.

The PLL frequency synthesizer 153 differs from the ADPLL circuit 1 illustrated in FIG. 1 in that a switch 9 is included further. As for other parts, the PLL frequency synthesizer 153 illustrated in FIG. 19 has the same configuration as the ADPLL circuit 1 illustrated in FIG. 1. Specifically, the PLL frequency synthesizer 153 includes, in addition to the digital controlled oscillators 4A and 4B and the switch 9, a divider 5, a digital phase-frequency detector 2, and a digital loop filter 3. In the following explanation, the same reference symbol will be attached to the same portion or the corresponding portion of the ADPLL circuit 1 of FIG. 1, and the explanation thereof may not be repeated.

The switch 9 is controlled by a DPFD controller 125 provided in the digital interface circuit 124. The DPFD controller 125 corresponds to the DPFD controller 7 illustrated in FIG. 1. When a control signal SW outputted from the DPFD controller 125 is "1" (operation mode of Mode 1), an output of the digital controlled oscillator 4B is inputted into a divider 5. When the control signal SW is "0" (operation mode of Mode 2), an output of the digital controlled oscillator 4A is inputted into the divider 5.

The divider 5 generates a low frequency clock signal CLKA by dividing the output of the switch 9 and a high frequency clock signal CLKB. A dividing ratio of the divider 5 is variable. A dividing ratio controller 126 provided in the digital interface circuit 124 sets up the dividing ratio of the divider 5 so that the digital controlled oscillators 4A and 4B may oscillate at the frequency corresponding to the telecommunications standards, such as GSM and WCDMA. As explained with reference to FIG. 18, in the case of data transmission according to the GSM/EDGE system, the PLL frequency synthesizer 153 is directly modulated by the polar modulation system. In the present case, the dividing ratio controller 126 modulates the dividing ratio of the divider 5 according to a phase-modulated signal outputted from the baseband circuit 122.

The configuration and the operation of the digital phase-frequency detector 2 and the digital loop filter 3 are the same as explained with reference to FIGS. 2-15, therefore, the explanation thereof will not be repeated.

Next, a transmitting circuit 110 and a receiving circuit 114 are explained. The transmitting circuit 110 illustrated in FIG. 19 includes a D/A converter 111, a quadrature modulator 112, and power amplifiers 113A and 113B.

When transmitting data in the WCDMA system, an oscillation output of the digital controlled oscillator 4A is modulated by the quadrature modulator 112. A modulating signal MS2 (an I signal and a Q signal) is converted into an analog signal by the D/A converter 111 and is supplied to the quadrature modulator 112 as a modulating signal. The power amplifier 113A amplifies a signal outputted from the quadrature modulator 112, and supplies it to an antenna element.

In the case of the WCDMA system, the PLL frequency synthesizer 153 operates in the operation mode of Mode 2 (control signal SW="0"). This is because in the case of the WCDMA system, the PLL frequency synthesizer 153 is employed as a local oscillator, accordingly, the narrow tracking range may be sufficient in the locking state. By operating the PLL frequency synthesizer 153 in Mode 2 (power saving mode), the current consumption of the PLL frequency synthesizer 153 can be reduced.

On the other hand, when transmitting data in the GSM/EDGE system, the PLL frequency synthesizer 153 is directly modulated according to the polar modulation system. Specifically, the dividing ratio of the divider 5 is modulated by the modulating signal MS1 outputted from the dividing ratio controller 126. An oscillation output of the digital controlled oscillator 4B is amplified by the power amplifier 113B, and supplied to the antenna element. Although not shown in FIG. 19, in the polar modulation system, the driving power source voltage of the power amplifier 113B is modulated by an amplitude-modulated signal generated in the baseband circuit 122.

In the case of the GSM/EDGE system, the PLL frequency synthesizer 153 operates in the operation mode of Mode 1 (control signal SW="1"). This is because in the case of GSM/EDGE system, a wide tracking range is required in a locking state because the PLL frequency synthesizer 153 is directly modulated. As explained in FIG. 2 and FIG. 3, the operation mode can be easily changed by the control signal SW and the enable signals EN1 and EN2. Therefore, the same PLL frequency synthesizer 153 can be shared for WCDMA and for GSM/EDGE; accordingly the circuit areas can be reduced.

The configuration of the receiving circuit 114 illustrated in FIG. 19 is the same as the configuration illustrated in FIG. 18, accordingly a brief explanation will be given hereafter. The receiving circuit 114 includes low-noise amplifiers 115A and 115B, quadrature demodulators 116A and 116B, and an A/D converter 117. The PLL frequency synthesizer 154 for reception generates local oscillation signals for WCDMA and for GSM/EDGE, and outputs them to the quadrature demodulators 116A and 116B, respectively.

When demodulating a reception signal of the WCDMA system, the reception signal amplified by the low-noise amplifier 115A is converted into a baseband signal by the quadrature demodulator 116A. The baseband signal outputted from the quadrature demodulator 116A undergoes digital conversion by the A/D converter 117, and is outputted to the baseband circuit 122. Similarly, when demodulating a reception signal of the GSM/EDGE system, the reception signal amplified by the low-noise amplifier 115B is converted into a baseband signal by the quadrature demodulator 116B. The baseband signal outputted from the quadrature demodulator 116B undergoes digital conversion by the A/D converter 117, and is outputted to the baseband circuit 122.

Figure 20:
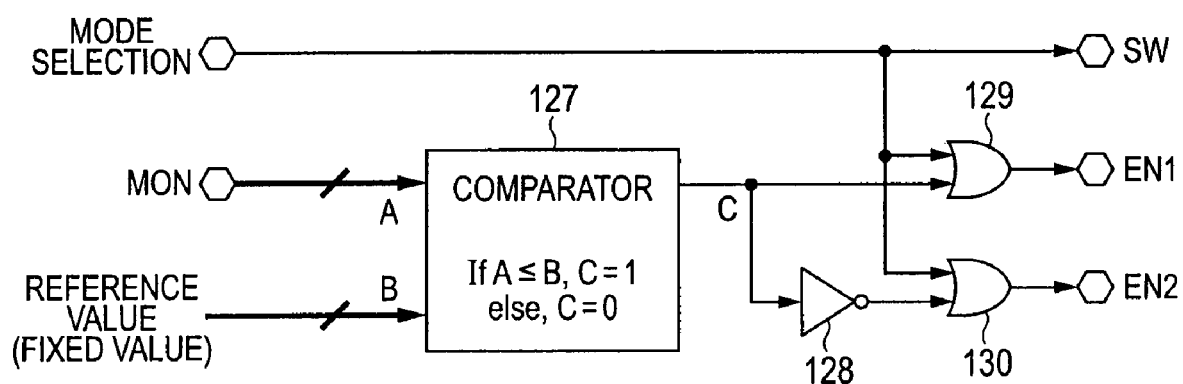
FIG. 20 is a block diagram illustrating an example of configuration of a DPFD controller 125 illustrated in FIG. 19.

FIG. 20 is a block diagram illustrating an example of configuration of the DPFD controller 125 illustrated in FIG. 19. As illustrated in FIG. 20, the DPFD controller 125 is a logic circuit which includes a comparator 127, an inverter 128, and OR circuits 129 and 130. Input signals to the DPFD controller 125 are a monitor signal MON (phase difference signal) from the digital phase-frequency detector 2, and the data of a selected value of the operation mode outputted from the baseband circuit 122, and a reference value. Output signals from the DPFD controller 125 are the control signal SW and the enable signals EN1 and EN2.

A mode selection value "1" corresponds to the operation mode of Mode 1 (high tracking range mode), and a mode selection value "0" corresponds to the operation mode of Mode 2 (power saving mode). The control signal SW is equal to the mode selection value. The reference value is used for comparison with the monitor signal MON, when shifting from the coarse adjustment period to the fine adjustment period in Mode 2.

The comparator 127 outputs "1" when the monitor signal is below the reference value (when within the predetermined range), and outputs "0" when the monitor signal exceeds the reference value. The OR circuit 129 performs operation of logical addition of the mode selection value and the output of the comparator 127, and outputs the result of the operation as the enable signal EN1. The inverter 128 inverts an output of the comparator 127. The OR circuit 130 performs operation of logical addition of the mode selection value and the output of the inverter 128, and outputs the result of the operation as the enable signal EN2.

According to the above-described configuration, when the mode selection value is "1" (Mode 1), both the control signal SW and the enable signals EN1 and EN2 are set to "1." When the mode selection value is "0" (Mode 2), the output of the DPFD controller 125 differ depending on the output of the comparator 127. When the output of the comparator 127 is "0" (coarse adjustment period), the control signal SW is set to "0", the enable signal EN1 is set to "0", and the enable signal EN2 is set to "1." On the other hand, when the output of the comparator 127 is "1" (fine adjustment period), the control signal SW is set to "0", the enable signal EN1 is set to "1", and the enable signal EN2 is set to "0." In this way, the same output as FIG. 3 is obtained by the circuit configuration of the DPFD controller 125 illustrated in FIG. 20.

Figure 21:
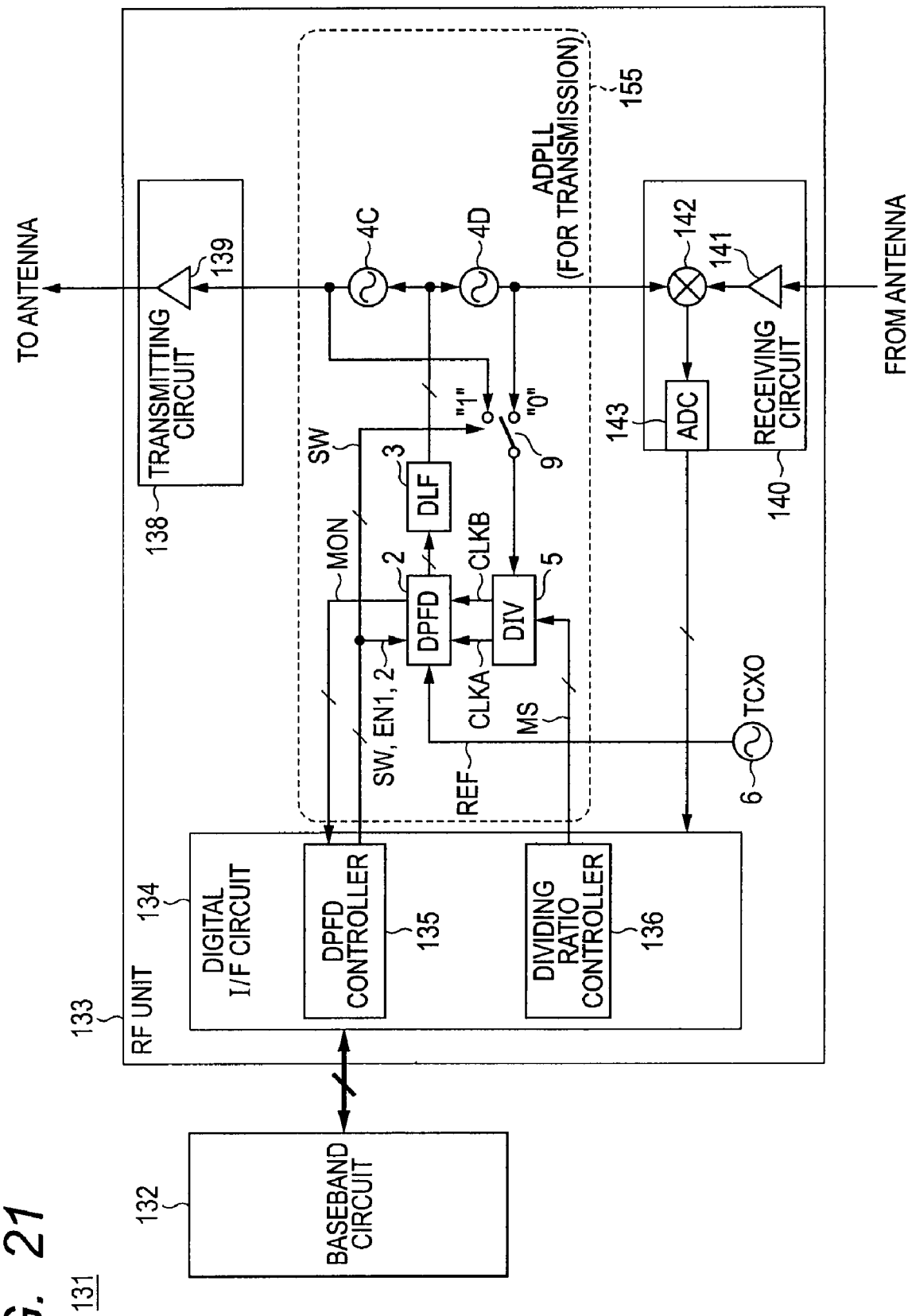
FIG. 21 is a block diagram illustrating configuration of a mobile-phone 131 as a further another example of application of the ADPLL circuit 1 illustrated in FIG. 1.

FIG. 21 is a block diagram illustrating configuration of a mobile-phone 131 as a further another example of application of the ADPLL circuit 1 illustrated in FIG. 1. In the mobile-phone 131 illustrated in FIG. 21, a PLL frequency synthesizer for reception and a PLL frequency synthesizer for transmission are united to one PLL frequency synthesizer 155. Unification of a synthesizer for transmission and a synthesizer for reception is possible in a system which does not perform transmission and reception simultaneously, such as GSM, Zigbee, WLAN, etc. A specific explanation is given in the following.

The mobile-phone 131 illustrated in FIG. 21 includes a baseband circuit 132 and an RF unit 133. The RF unit 133 includes the PLL frequency synthesizer 155, a digital interface circuit 134, a transmitting circuit 138, a receiving circuit 140, and a temperature compensated crystal oscillator 6.

The PLL frequency synthesizer 155 has the same configuration as the PLL frequency synthesizer 153 illustrated in FIG. 19. The PLL frequency synthesizer 155 includes digital controlled oscillators 4C and 4D, a switch 9, a divider 5, a digital phase-frequency detector 2, and a digital loop filter 3. In the case of FIG. 21, the digital controlled oscillator 4C for transmission is provided instead of the digital controlled oscillator 4B of FIG. 19, and the digital controlled oscillator 4D for reception is provided instead of the digital controlled oscillator 4A of FIG. 19. The switch 9 is controlled by a control signal SW. When the control signal SW is "1" (Mode 1), an output of the digital controlled oscillator 4C is inputted into the divider 5. When the control signal SW is "0" (Mode 2), an output of the digital controlled oscillator 4D is inputted into the divider 5.

The transmitting circuit 138 includes a power amplifier 139. The power amplifier 139 amplifies the output of the digital controlled oscillator 4C, and outputs it to an antenna element. Although not shown in FIG. 21, in the polar modulation system, the driving power source voltage of the power amplifier 139 is modulated by an amplitude-modulated signal generated in the baseband circuit 132.

At the time of transmission, the PLL frequency synthesizer 155 operates in the operation mode of Mode 1 (control signal SW="1"). This is because a wide tracking range is required in a locking state since the direct modulation of the PLL frequency synthesizer 155 is performed.

The receiving circuit 140 includes a low-noise amplifier 141, a quadrature demodulator 142, and an A/D converter 143. A reception signal amplified by the low-noise amplifier 141 is converted into a baseband signal by the quadrature demodulator 142. The baseband signal outputted from the quadrature demodulator 142 undergoes digital conversion by the A/D converter 143, and is outputted to the baseband circuit 132.

The PLL frequency synthesizer 155 for reception is used as a local oscillator, generates a local oscillation signal, and outputs it to the quadrature demodulator 142. In this case, the PLL frequency synthesizer 155 operates in the operation mode of Mode 2 (control signal SW="0"). This is because a narrow tracking range maybe sufficient in a locking state since the PLL frequency synthesizer 155 is used as a local oscillator. By operating the PLL frequency synthesizer 155 in Mode 2 (power saving mode), the current consumption of the PLL frequency synthesizer 155 can be reduced.

The operation mode can be easily changed by the control signal SW, and the enable signals EN1 and EN2. Therefore, the same PLL frequency synthesizer 155 can be shared by one for transmission and one for reception; accordingly the circuit areas can be reduced.

(Embodiment 2)

Figure 22:
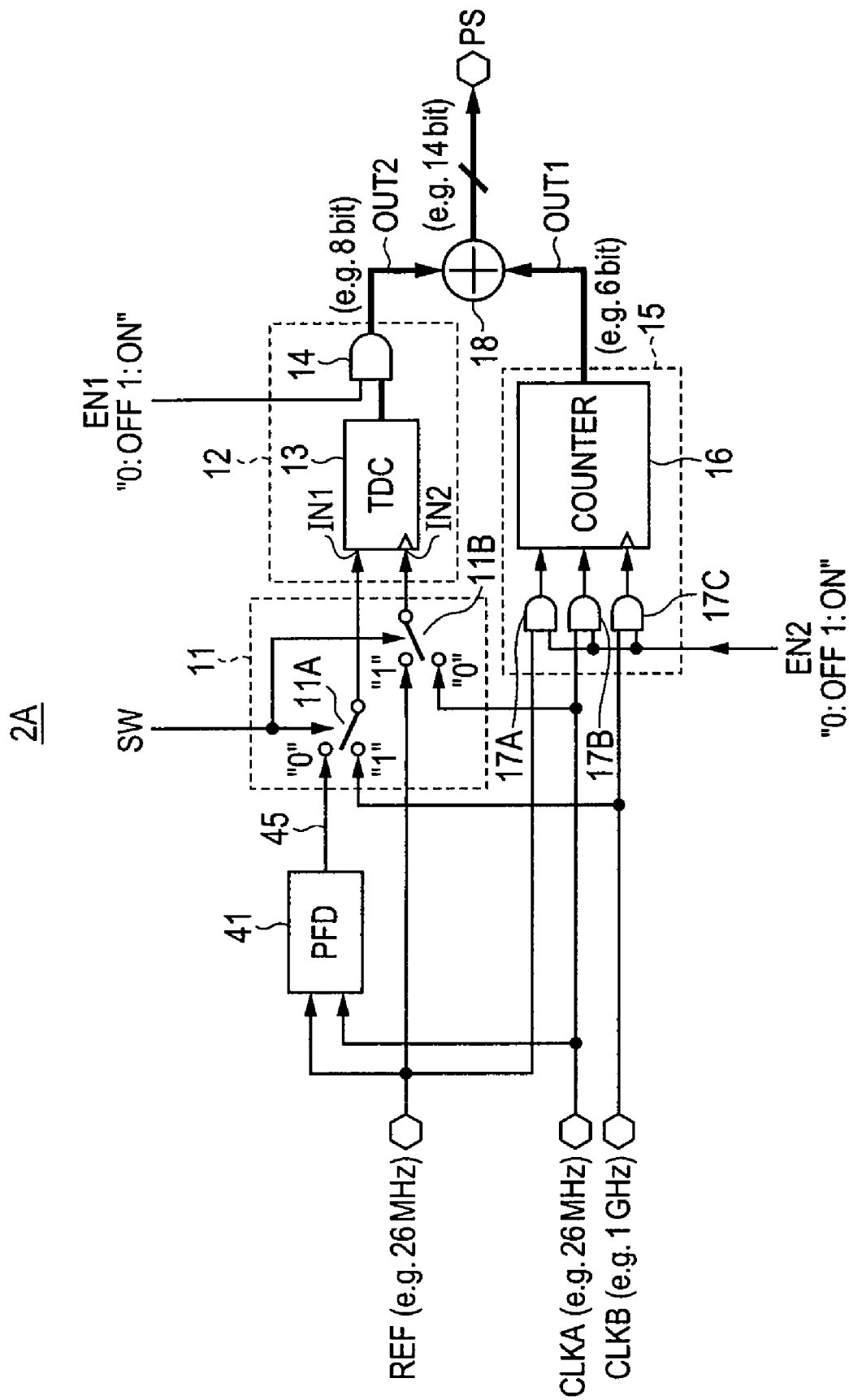
FIG. 22 is a block diagram illustrating configuration of a digital phase-frequency detector 2A according to Embodiment 2 of the present invention.

FIG. 22 is a block diagram illustrating configuration of a digital phase-frequency detector 2A according to Embodiment 2 of the present invention.

The digital phase-frequency detector 2A illustrated in FIG. 22 differs from the digital phase-frequency detector 2 illustrated in FIG. 2 in that a phase determination unit 41 (PFD) is further included in the input side of a switch 11A. The phase determination unit 41 receives the reference clock signal REF and the low frequency clock signal CLKA. When the control signal SW is "0" (Mode 2), an output of the phase determination unit 41 is inputted into an input node IN1 of a time-to-digital converter 13 via the switch 11A. When the control signal SW is "1" (Mode 1), the high frequency clock signal CLKB is inputted into the input node IN1 of the time-to-digital converter 13 via the switch 11A, same as in the case of FIG. 2. As for the other portions, the digital phase-frequency detector 2A illustrated in FIG. 22 is the same as the digital phase-frequency detector 2 illustrated in FIG. 2. Therefore, the same reference symbol will be given to the same portion or the corresponding portion, and the explanation thereof is not repeated.

The phase determination unit 41 outputs a pulse signal which rises to the same timing as the rising of the reference clock signal REF and falls to the timing of the rising of the low frequency clock signal CLKA, when the phase of the reference clock signal REF is leading compared with the phase of the low frequency clock signal CLKA. That is, when the reference clock signal REF is leading in phase compared with the low frequency clock signal CLKA, the output 45 of the phase determination unit 41 is proportional to the phase difference between these clock signals. On the contrary, when the reference clock signal REF is delayed in phase compared with the low frequency clock signal CLKA, a value "0" is outputted. In this way, the phase determination unit 41 determines whether the reference clock signal REF is leading or delayed in phase compared with the low frequency clock signal CLKA.

The phase determination unit 41 has the same configuration as the well-known phase frequency detector (PFD), and it can be formed by a logic circuit.

Figure 23:
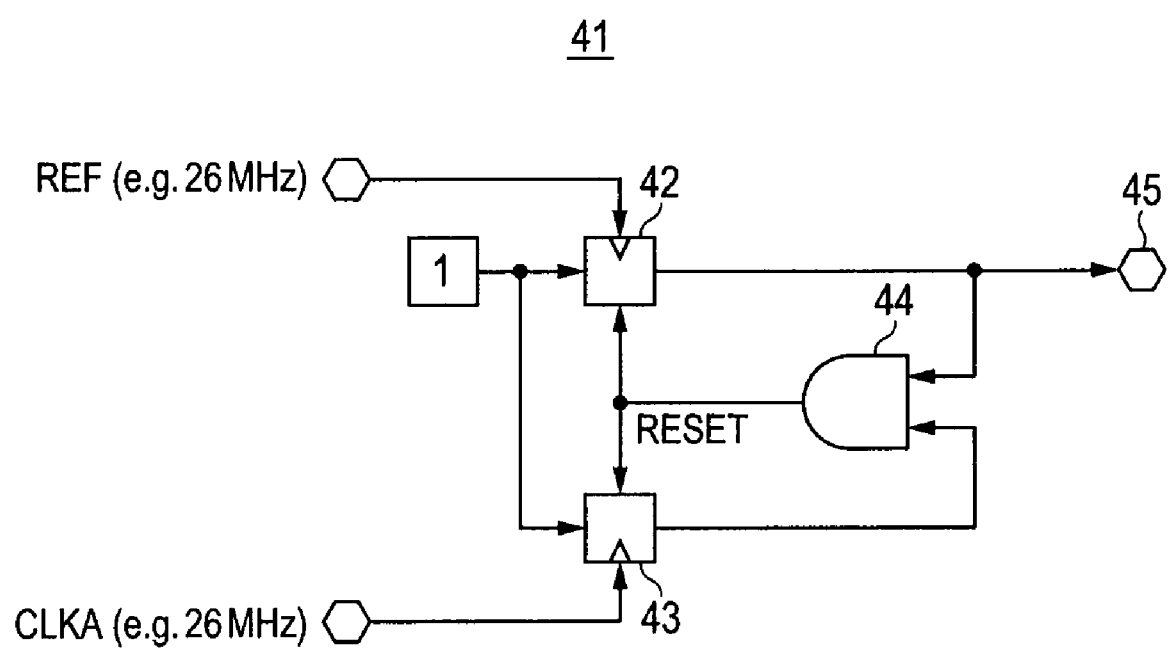
FIG. 23 is a block diagram illustrating an example of configuration of a phase determination unit 41 illustrated in FIG. 22.

FIG. 23 is a block diagram illustrating an example of configuration of the phase determination unit 41 illustrated in FIG. 22. As illustrated in FIG. 23, the phase determination unit 41 includes D flip-flops 42 and 43 and an AND circuit 44. The reference clock signal REF is inputted into a clock terminal of the D flip-flop 42, and the low frequency clock signal CLKA is inputted into a clock terminal of the D flip-flop 43. An input terminal of each of the D flip-flops 42 and 43 is fixed to "1" (H level). The AND circuit 44 receives the outputs of the D flip-flops 42 and 43, and when both outputs are "1" (H level), the D flip-flops 42 and 43 are reset. The output of the D flip-flop 42 is used as an output signal 45 of the phase determination unit 41.

Figure 24A:
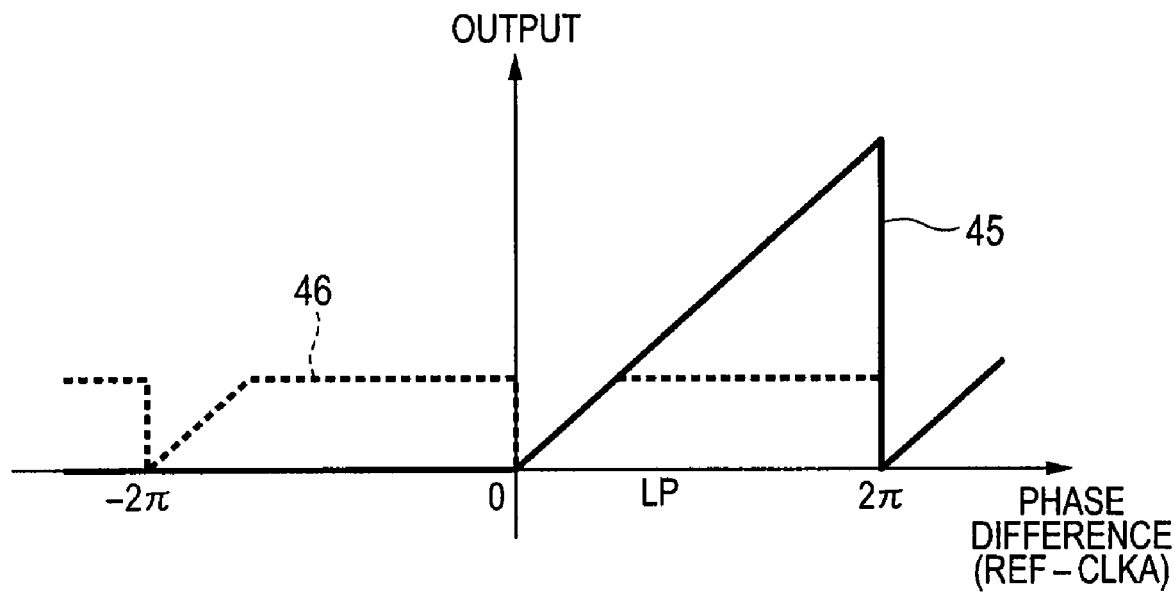
FIG. 24 (A) is a drawing illustrating relation between the phase difference of an input signal and the output of the digital phase-frequency detector 2A illustrated in FIG. 22.
Figure 24B:
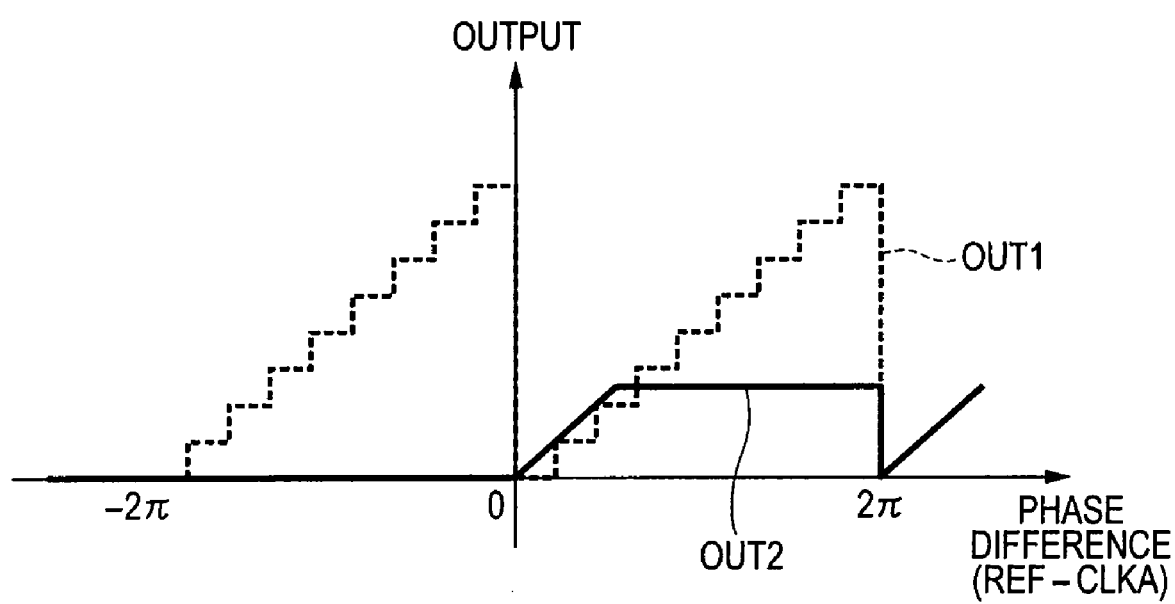

FIG. 24 (A) illustrates relation between the phase difference of the input signal and the output of the digital phase-frequency detector 2A illustrated in FIG. 22. FIG. 24 (B) illustrates another relation between the phase difference of the input signal and the output of the digital phase-frequency detector 2A illustrated in FIG. 22. The horizontal axis of FIG. 24 (A) and FIG. 24 (B) shows the phase difference (REF-CLKA) between the reference clock signal REF and the low frequency clock signal CLKA and the vertical axis shows the magnitude of the output signal.

In FIG. 24 (A), a solid-line graph 45 indicates relation between the phase difference of the input signal and the output of the phase determination unit 41 illustrated in FIG. 23. The dashed-line graph 46 indicates relation between the phase difference of the input signal and the output of the time-to-digital converter 13 when the phase determination unit 41 is not provided, and is the same as the solid-line graph of FIG. 14.

In FIG. 24 (B), a dashed-line graph indicates relation between the output OUT1 and the phase difference of the counter 16 illustrated in FIG. 22. A solid-line graph indicates relation between the output OUT2 and the phase difference of the time-to-digital converter 13 of the digital phase-frequency detector 2A illustrated in FIG. 22. The solid-line graph of FIG. 24 (B) corresponds to what combines the solid-line graph 45 and the dashed-line graph 46 of FIG. 24 (A).

When FIG. 14 and FIG. 24 (B) are compared, in the case of FIG. 14, as the phase difference changes from the positive state to the negative state, the output OUT2 of the time-to-digital converter 13 exhibits a jump. On the other hand, in the case of FIG. 24 (B) in which the phase determination unit 41 is provided, when the phase difference is negative or the phase is delayed, the output OUT2 is fixed to "0." Therefore, even when the phase difference changes from the positive state to the negative state, the output OUT2 of the time-to-digital converter 13 exhibits no jump. In this way, it is possible to improve the input-output characteristics of the digital phase-frequency detector, by providing the phase determination unit 41.

(Embodiment 3)

It is assumed that locking of the PLL frequency synthesizer has established at a time when the phase difference (time difference) between the reference clock signal REF and the low frequency clock signal CLKA is approximately zero. In this case, when the phase difference shifts to the minus side due to disturbance, such as a temperature change, the value of the output of the digital phase-frequency detector 2 will change rapidly, as the graph of the input-output characteristics of FIG. 14 indicates. As a result, the locking of the PLL frequency synthesizer may be freed, causing a problem. In Embodiment 3, offsets are added to the outputs of the counter 16 and the time-to-digital converter 13, so that the outputs of the counter 16 and the time-to-digital converter 13 may lock at the center of the respective linear output range.

Figure 25:
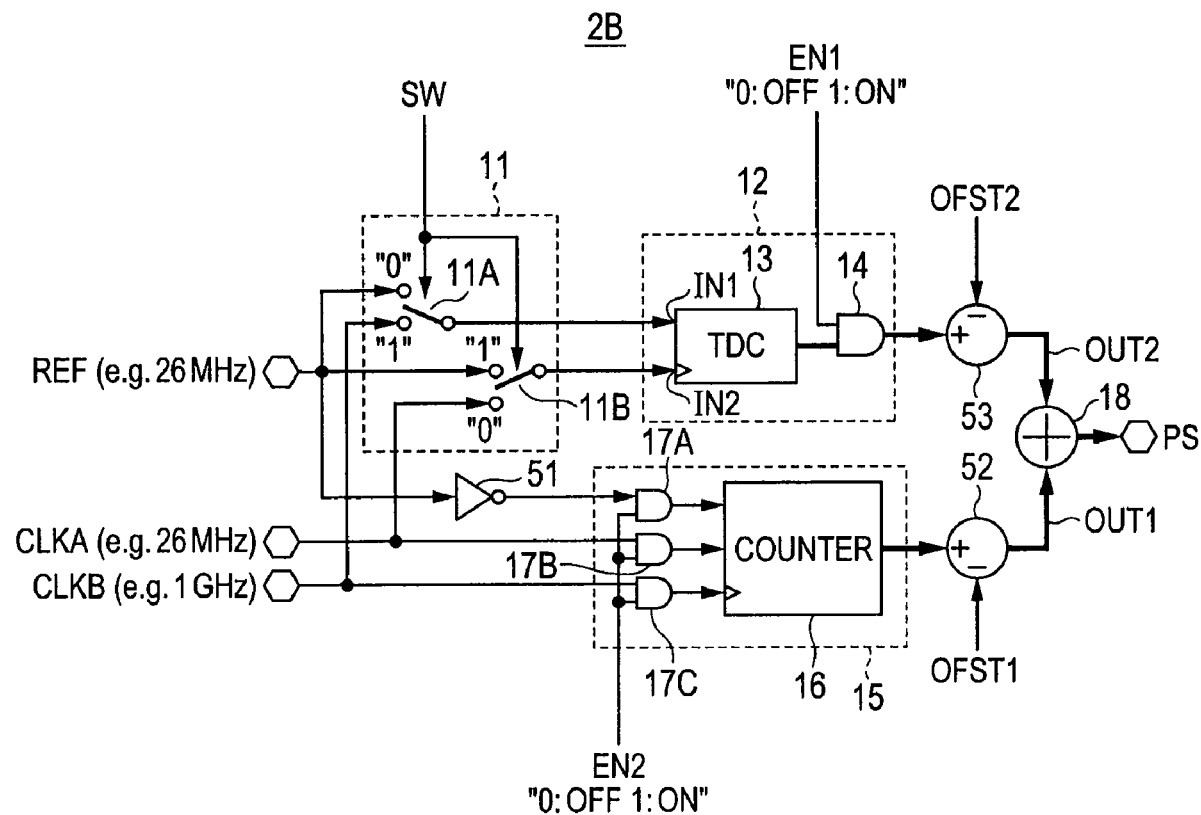
FIG. 25 is a block diagram illustrating configuration of a digital phase-frequency detector 2B according to Embodiment 3 of the present invention.

FIG. 25 is a block diagram illustrating configuration of a digital phase-frequency detector 2B according to Embodiment 3 of the present invention.

The digital phase-frequency detector 2B illustrated in FIG. 25 differs from the digital phase-frequency detector 2 illustrated in FIG. 2 in that an inverter 51 (a phase shifter) is included further in order to shift by 180 degrees the phase of the reference clock signal REF to be inputted into the first detector 15.

The digital phase-frequency detector 2B differs from the digital phase-frequency detector 2 illustrated in FIG. 2 in that a subtractor 52 (a first offset adder) which adds an offset to the output of the first detector 15 and a subtractor 53 (a second offset adder) which adds an offset to the output of the second detector 12 are included further. The subtractor 52 outputs to the adder 18 a value OUT1 obtained after an offset OFST1 is subtracted from the output of the first detector 15. The subtractor 53 outputs to the adder 18 a value OUT2 obtained after an offset OFST2 is subtracted from the output of the second detector 12.

The other portions of the digital phase-frequency detector 2B illustrated in FIG. 25 are the same as the digital phase-frequency detector 2 illustrated in FIG. 2. Therefore, the same reference symbol will be given to the same portion or the corresponding portion, and the explanation thereof is not repeated.

Figure 26:
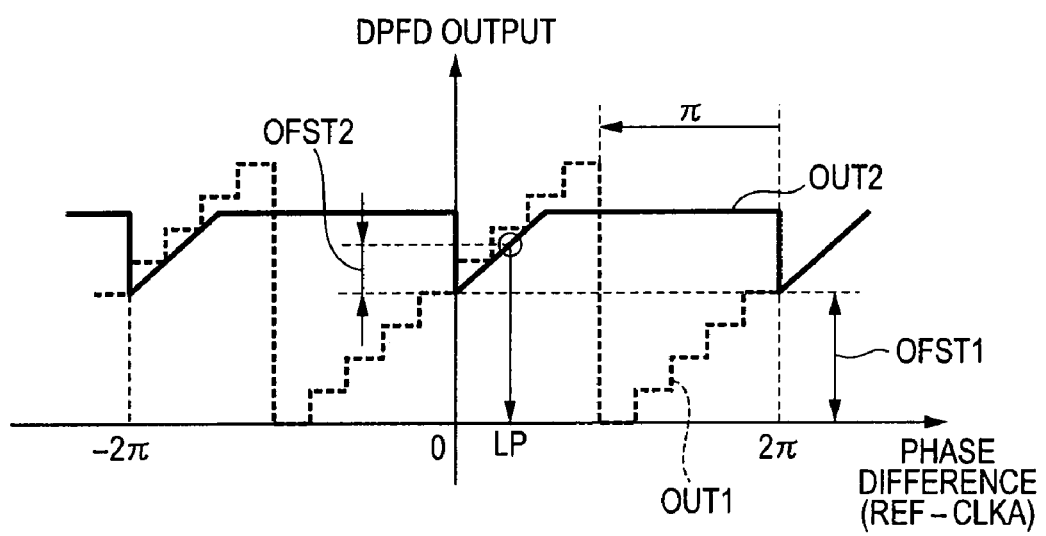
FIG. 26 is a drawing illustrating relation between the phase difference of an input signal and the output of the digital phase-frequency detector 2B illustrated in FIG. 25.

FIG. 26 illustrates relation between the phase difference of the input signal and the output of the digital phase-frequency detector 2B illustrated in FIG. 25. In FIG. 26, the horizontal axis shows the phase difference (REF-CLKA) of the reference clock signal REF and the low frequency clock signal CLKA and the vertical axis shows the magnitude of the output signal.

When the graph of FIG. 26 is compared with the graph of FIG. 14, first, by providing the inverter 51 of FIG. 25, the output OUT1 of the counter 16 indicated by the dashed-line graph of FIG. 26 is shifted by $\pi$ in the horizontal direction.

Next, by subtracting the offset OFST1 from the output of the counter 16 with the subtractor 52, the lock point LP shifts upward by the magnitude of the offset OFST1. The magnitude of the offset OFST1 is determined so that the output of the counter 16 locks at the center of the linear range. Specifically, it is preferable to set to the offset OFST1 a quantity corresponding to a half cycle of the reference clock signal REF.

Further, by subtracting the offset OFST2 from the output of the time-to-digital converter 13 with the subtractor 53, the final lock point LP shifts upward by the magnitude of the offset OFST2. The magnitude of the offset OFST2 is determined so that the output of the time-to-digital converter 13 locks at the center of the linear range. Specifically, it is preferable to set to the offset OFST2 a mean value of the output of the time-to-digital converter 13. For example, when the output of the time-to-digital converter 13 varies from 0 to 255, a half of the output, or 128, is set to the offset OFST2.

By the above-described scheme, it is possible to avoid the locking of the PLL frequency synthesizer from being freed, even when the lock point varies due to disturbance. Since the locking is established in a position where the rising edge of the reference clock signal REF and the rising edge of the low frequency clock signal CLKA are not aligned, it is possible to reduce a determination error, compared with a case where the rising edges are aligned.

(Embodiment 4)

Figure 27:
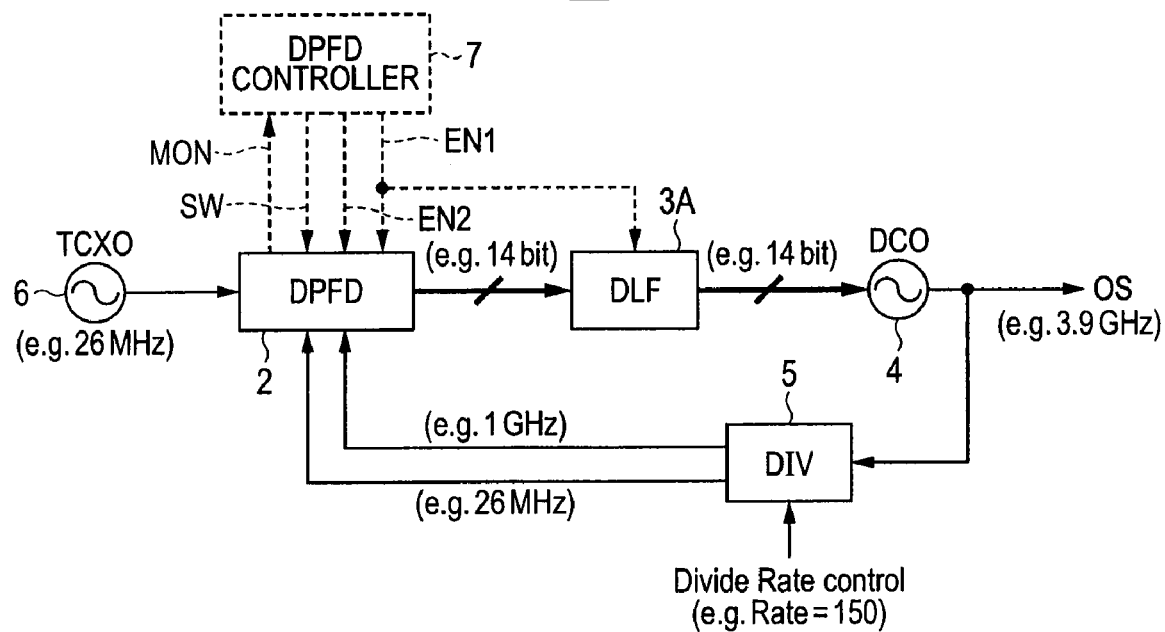
FIG. 27 is a block diagram illustrating configuration of an ADPLL circuit 1C according to Embodiment 4 of the present invention.

FIG. 27 is a block diagram illustrating configuration of an ADPLL circuit 10 according to Embodiment 4 of the present invention.

The ADPLL circuit 1C illustrated in FIG. 27 differs from the ADPLL circuit 1 illustrated in FIG. 1 in that the bandwidth of the digital loop filter 3A is controlled by the enable signal EN1. During the coarse adjustment period of Mode 2 when the enable signal EN1 is in a non-active state ("0"), the bandwidth of the digital loop filter 3A is set wider than the normal case (Mode 1). In the fine adjustment period of Mode 2 when the enable signal EN1 is in an active state ("1"), the bandwidth is returned to the usual bandwidth.

The reason for the control to be performed as described above is explained in the following. The other points of FIG. 27 are the same as the ADPLL circuit 1 illustrated in FIG. 1. Therefore, the same reference symbol will be given to the same portion or the corresponding portion, and the explanation thereof is not repeated.

Figure 28:
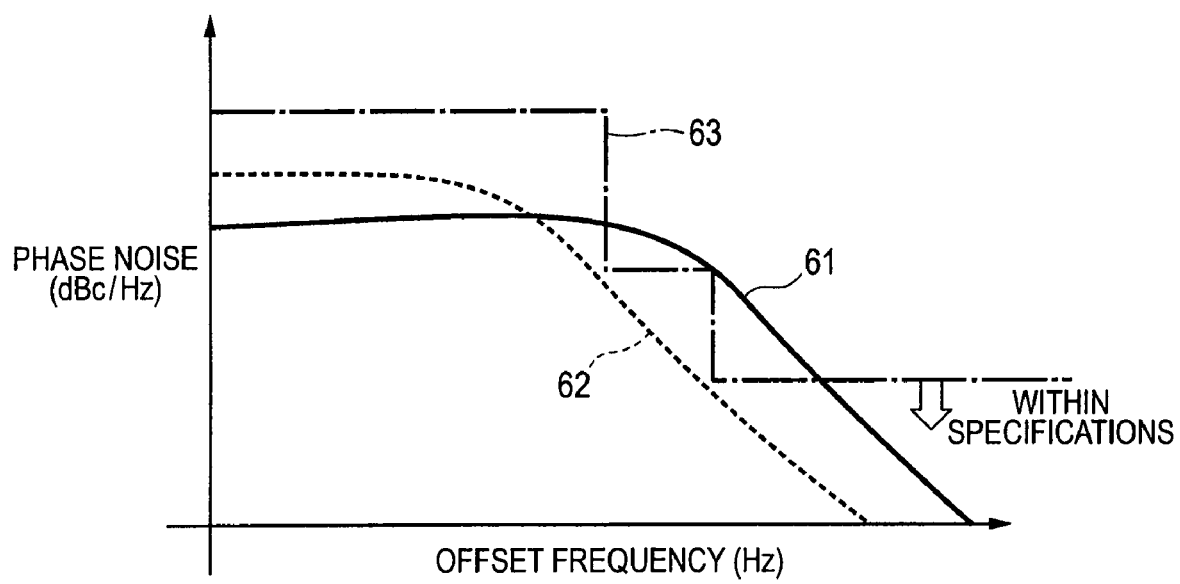
FIG. 28 is an explanatory drawing of a phase noise characteristic of the ADPLL circuit 1C illustrated in FIG. 27.

FIG. 28 is an explanatory drawing of a phase noise characteristic of the ADPLL circuit 1C illustrated in FIG. 27. In FIG. 28, the horizontal axis shows frequency and the vertical axis shows a phase noise (dBc/Hz). The dashed-line graph 62 indicates a phase noise characteristic in a case of the normal bandwidth, and the solid-line graph 61 indicates a phase noise characteristic when the loop bandwidth is made wider than the normal bandwidth. The dash-dotted-line graph 63 is assumed to be a specification value of a phase noise characteristic defined by the system. As seen from FIG. 28, when the loop bandwidth is made wider, the specification value may not be satisfied in some cases, due to the accompanying deterioration of the phase noise characteristic.

FIG. 29 is an explanatory drawing of lock-up time of the ADPLL circuit 1C illustrated in FIG. 27. The upper drawing (A) of FIG. 29 illustrates a case where the loop bandwidth is made wider than the normal bandwidth, and the lower drawing (B) of FIG. 29 illustrates a case of the normal loop bandwidth. A lock-up time 64 in the case of the upper drawing (A) of FIG. 29 is shorter than a lock-up time 65 in the case of the lower drawing (B) of FIG. 29. Accordingly, it is possible to shorten the convergence time by widening the loop bandwidth.

The above-described consideration leads to the following result; that is, in the coarse adjustment period of Mode 2 (EN1="0"), the convergence time can be preferably shortened by widening the loop bandwidth, and in the fine adjustment period (EN1="1"), the phase noise characteristic can be preferably improved by narrowing the loop bandwidth. Unlike an analog loop filter, change of the loop bandwidth is easy for the digital loop filter.

It should be understood by those skilled in the art that all the embodiments disclosed in the present description are given by way of illustration only in all aspects, and thus are not to be restrictive. The scope of the present invention is indicated by the scope of the appended claims not by the above-described explanation, and it is meant that various modifications, combinations, sub-combinations, and alterations may be included insofar as they are within the scope of the appended claims or the equivalents thereof.

What is claimed is:

1. A phase-locked loop circuit comprising:
   an oscillator operable to oscillate at a frequency corresponding to a phase difference signal;
   a divider operable to generate a first clock obtained by dividing an output of the oscillator and a second clock higher than the first clock in frequency; and
   a phase comparator,
   wherein the phase comparator includes:
   a first detector which receives the first clock, the second clock, and a reference clock, detects a phase difference between the first clock and the reference clock to an accuracy of a first time period given by a cycle of the second clock, and outputs the phase difference signal corresponding to the detected phase difference until the detected phase difference reaches a predetermined range; and
   a second detector which receives the first clock and the reference clock, detects the phase difference between the first clock and the reference clock to an accuracy of a second time period shorter than the first time period after the phase difference detected by the first detector reaches the predetermined range, and outputs the phase difference signal corresponding to the detected phase difference.

2. The phase-locked loop circuit according to claim 1,
   wherein the first detector detects the phase difference between the first clock and the reference clock by counting a clock number of the second clock, and
   wherein the second detector detects the phase difference between the first clock and the reference clock, by delaying one of the first clock and the reference clock every the second time period to generate a delayed signal and by comparing the delayed signal with the other one of the first clock and the reference clock.

3. The phase-locked loop circuit according to claim 1,
   wherein the phase comparator further includes
   a phase determination unit operable to determine whether one of the first clock and the reference clock is leading or delayed in phase with respect to the other one of the first clock and the reference clock, and
   wherein, in accordance with the determination result of the phase determination unit, the second detector outputs the phase difference signal corresponding to the phase difference between the first clock and the reference clock in the case of leading phase, and outputs the phase difference signal corresponding to zero phase difference in the case of delayed phase.

4. The phase-locked loop circuit according to claim 1,
   wherein the phase comparator further includes:
   a phase shifter operable to shift, by a predetermined amount, phase of either one of the first clock and the reference clock which are inputted to the first detector;
   a first offset adder operable to add an offset to an output of the first detector so as to make the output of the first detector be locked at near a central value of the output range thereof; and
   a second offset adder operable to add an offset to an output of the second detector so as to make the output of the second detector be locked at near a central value of the output range thereof.

5. The phase-locked loop circuit according to claim 1,
   further comprising:
   a loop filter which limits, to a variable bandwidth, the phase difference signal outputted by the phase comparator and outputs the bandwidth-limited phase difference signal to the oscillator,
   wherein the bandwidth of the loop filter after a first point of time when the phase difference detected by the first detector reaches the predetermined range is narrower than the bandwidth before the first point of time.

6. A phase-locked loop circuit having a first operation mode and a second operation mode, the phase-locked loop circuit comprising:
   an oscillator operable to oscillate at a frequency corresponding to a phase difference signal;
   a divider operable to generate a first clock obtained by dividing an output of the oscillator and a second clock higher than the first clock in frequency; and
   a phase comparator,
   wherein the phase comparator includes:
   a first detector which receives the first clock, the second clock, and a reference clock and detects a phase difference between the first clock and the reference clock to an accuracy of a first time period given by a cycle of the second clock;
   a switching unit which receives the first clock and the second clock and outputs the first clock in the second operation mode and the second clock in the first operation mode;
   a second detector which receives an output of the switching unit and the reference clock and detects the phase difference between the output of the switching unit and the reference clock to an accuracy of a second time period shorter than the first time period; and
   a phase difference signal generating unit which generates the phase difference signal,
   wherein, in the first operation mode, the second detector detects the phase difference in parallel with the first detector, and the phase difference signal generating unit generates the phase difference signal by composing the phase differences detected by the first detector and the second detector, and
   wherein, in the second operation mode, the second detector starts to detect the phase difference from a first point of time when the phase difference detected by the first detector reaches a predetermined range, and the phase difference signal generating unit outputs the phase difference signal corresponding to the phase difference detected by the first detector until the first point of time, and outputs the phase difference signal corresponding to the phase difference detected by the second detector after the first point of time.

7. The phase-locked loop circuit according to claim 6,
   wherein the first detector detects the phase difference between the first clock and the reference clock by counting a clock number of the second clock, and
   wherein the second detector detects the phase difference between the output of the switching unit and the reference clock, by delaying one of the output of the switching unit and the reference clock every the second time period to generate a delayed signal and by comparing the delayed signal with the other one of the output of the switching unit and the reference clock.

8. A communication apparatus having a first operation mode and a second operation mode and sending transmitting data, the communication apparatus comprising:
   an oscillator operable to oscillate at a frequency corresponding to a phase difference signal;
   a modulator which receives an output of the oscillator and, in the second operation mode, modulates the output of the oscillator by the transmitting data after the oscillating frequency of the oscillator stabilizes;
   a divider which generates a first clock obtained by dividing the output of the oscillator and a second clock higher than the first clock in frequency;
   a dividing ratio controller which changes a dividing ratio of the divider in the first operation mode, according to the transmitting data after the oscillating frequency of the oscillator stabilizes; and
   a phase comparator,
   wherein the phase comparator includes:
   a first detector which receives the first clock, the second clock, and a reference clock, and detects a phase difference between the first clock and the reference clock to an accuracy of a first time period given by a cycle of the second clock;
   a switching unit which receives the first clock and the second clock and outputs the first clock in the second operation mode and the second clock in the first operation mode;
   a second detector which receives an output of the switching unit and the reference clock and detects a phase difference between the output of the switching unit and the reference clock to an accuracy of a second time period shorter than the first time period; and
   a phase difference signal generating unit which generates the phase difference signal,
   wherein, in the first operation mode, the second detector detects the phase difference in parallel with the first detector, and the phase difference signal generating unit generates the phase difference signal by composing the phase differences detected by the first detector and the second detector, and
   wherein, in the second operation mode, the second detector starts to detect the phase difference from a first point of time when the phase difference detected by the first detector reaches a predetermined range, and the phase difference signal generating unit outputs the phase difference signal corresponding to the phase difference detected by the first detector until the first point of time and outputs the phase difference signal corresponding to the phase difference detected by the second detector after the first point of time.

9. A communication apparatus having a first operation mode for sending transmitting data and a second operation mode for receiving a reception signal, the communication apparatus comprising:
   an oscillator operable to oscillate at a frequency corresponding to a phase difference signal;
   a mixer operable to mix an output of the oscillator and the reception signal in the second operation mode, after the oscillating frequency of the oscillator stabilizes;
   a divider operable to generate a first clock obtained by dividing the output of the oscillator and a second clock higher than the first clock in frequency;
   a dividing ratio controller operable to change a dividing ratio of the divider in the first operation mode, according to the transmitting data; and
   a phase comparator,
   wherein the phase comparator includes:
   a first detector which receives the first clock, the second clock, and a reference clock, and detects a phase difference between the first clock and the reference clock to an accuracy of a first time period given by a cycle of the second clock;
   a switching unit which receives the first clock and the second clock and outputs the first clock in the second operation mode and the second clock in the first operation mode;
   a second detector which receives an output of the switching unit and the reference clock and detects a phase difference between the output of the switching unit and the reference clock to an accuracy of a second time period shorter than the first time period; and a phase difference signal generating unit operable to generate the phase difference signal, wherein, in the first operation mode, the second detector detects the phase difference in parallel with the first detector, and the phase difference signal generating unit generates the phase difference signal by composing the phase differences detected by the first detector and the second detector, and wherein, in the second operation mode, the second detector starts to detect the phase difference from a first point of time when the phase difference detected by the first detector reaches a predetermined range, and the phase difference signal generating unit outputs the phase difference signal corresponding to the phase difference detected by the first detector until the first point of time, and outputs the phase difference signal corresponding to the phase difference detected by the second detector after the first point of time.

* * * * *